(12) United States Patent
Shiba et al.

(10) Patent No.: US 7,247,357 B2
(45) Date of Patent: Jul. 24, 2007

(54) IMAGE DISPLAY DEVICE

(75) Inventors: Takeo Shiba, Kodaira (JP); Motoyasu Terao, Hinode (JP); Hideyuki Matsuoka, Nishitokyo (JP)

(73) Assignee: Hitachi Displays, Ltd., Chiba-ken (JP)

( * ) Notice: Subject to any disclaimer, the term of this patent is extended or adjusted under 35 U.S.C. 154(b) by 184 days.

(21) Appl. No.: 10/772,447

(22) Filed: Feb. 6, 2004

(65) Prior Publication Data
US 2004/0258866 A1 Dec. 23, 2004

(30) Foreign Application Priority Data
Jun. 19, 2003 (JP) ............................. 2003-174235

(51) Int. Cl.
*H01L 27/108* (2006.01)
(52) U.S. Cl. .................. 428/1.51; 428/1.1; 345/98; 349/53; 257/298
(58) Field of Classification Search .............. 428/1.1, 428/1.5, 1.51; 257/57, 59, 69, 72, 257, 288, 257/298, 392, 908; 345/90–92, 98; 349/43, 349/53
See application file for complete search history.

(56) References Cited
U.S. PATENT DOCUMENTS

| | | | | | |
|---|---|---|---|---|---|
| 4,432,610 | A | * | 2/1984 | Kobayashi et al. ............ 349/42 |
| 4,868,616 | A | * | 9/1989 | Johnson et al. ................ 257/63 |
| 5,262,987 | A | * | 11/1993 | Kojima ................... 365/185.32 |
| 5,296,716 | A | * | 3/1994 | Ovshinsky et al. ............. 257/3 |
| 5,335,219 | A | * | 8/1994 | Ovshinsky et al. ......... 369/288 |
| 5,523,970 | A | * | 6/1996 | Riggio, Jr. ............. 365/185.01 |
| 5,694,146 | A | * | 12/1997 | Ovshinsky et al. ........... 345/91 |
| 5,821,911 | A | * | 10/1998 | Jachimowicz .................. 345/7 |
| 6,025,252 | A | * | 2/2000 | Shindo et al. .............. 438/509 |
| 6,384,435 | B1 | * | 5/2002 | Aratani ....................... 257/208 |
| 6,549,447 | B1 | * | 4/2003 | Fricke et al. ................ 365/105 |
| 6,621,130 | B2 | * | 9/2003 | Kurokawa et al. .......... 257/390 |
| 6,700,813 | B2 | * | 3/2004 | Inui ............................ 365/158 |
| 6,703,252 | B2 | * | 3/2004 | Chen et al. ................... 438/20 |
| 6,717,179 | B1 | * | 4/2004 | Yamazaki et al. ............ 257/59 |

FOREIGN PATENT DOCUMENTS

| | | |
|---|---|---|
| JP | 8-286170 | 2/1996 |
| JP | 11-85065 | 9/1997 |
| JP | 2000-252373 | 3/1999 |
| JP | 2001-326289 | 3/2001 |

\* cited by examiner

*Primary Examiner*—Terrel Morris
*Assistant Examiner*—Sow-Fun Hon
(74) *Attorney, Agent, or Firm*—Reed Smith LLP; Stanley P. Fisher, Esq.; Juan Carlos A. Marquez, Esq.

(57) ABSTRACT

The image display device has a display section formed of plural pixels and a control section which controls the display section, and is provided with nonvolatile phase-change type pixel memories in respective ones of the pixels, or is provided with a nonvolatile phase-change type frame memory in the control section. Each of the nonvolatile phase-change type pixel memories is formed of one or more switches and a variable-resistance memory element fabricated from a chalcogenide material for storing display data for at least a specified period of time. The nonvolatile phase-change type frame memory is formed of one or more switches and a variable-resistance memory element fabricated from a chalcogenide material for retaining display data for one frame.

19 Claims, 17 Drawing Sheets

IMAGE DISPLAY DEVICE

BACKGROUND OF THE INVENTION

1. Field of the Invention

The present invention relates to an image display device which facilitates production of high-quality images, and particularly to an image display device capable of reducing power consumption by fabricating memories for displaying images with TFTs (Thin Film Transistors).

2. Description of Prior Art

In a first conventional technique, an active matrix type display device using TFTs incorporates therein a nonvolatile memory composed of TFTs fabricated on the same substrate and in the same fabrication processes as for pixel-driving TFTs, as disclosed in Japanese Patent Laid-Open Publication Nos. 2,000-252,373 and 2,001-326,289, for example. FIG. 16 illustrates a configuration of the display device employing the first conventional technique. In a display section 100, pixels 104 are arranged in a matrix fashion (in order to simplify the diagram, only one of the pixels 104 is shown). In both the above publications, used as the nonvolatile semiconductor memory is an EEPROM (Electrically Erasable Programmable Read Only Memory) having charge-storage layers and floating gates, and disposed around the display section 100 are a signal-related circuit 101, a scanning-related circuit 102, and a nonvolatile semiconductor memory 103. This configuration makes it possible to incorporate the function of the nonvolatile semiconductor memory without use of LSI (Large-Scale Integration) into the display device.

In a second conventional technique, a display device uses as a frame memory a semiconductor memory composed of TFTs fabricated on the same substrate and in the same fabrication processes as for pixel-driving TFTs, as disclosed in detail in Japanese Patent Laid-Open Publication No. Hei 11-85,065, for example. FIG. 17 illustrates a configuration of this display device. Pixels 115 are arranged in a matrix fashion in a display region 110, are coupled to a D/A (Digital-to-Analog) converter circuit 113 via signal lines 116, and are also coupled to a scanning-related circuit 114 via gate lines 117. Coupled to the D/A converter circuit 113 are a frame memory 112 and a signal-related circuit 111. The frame memory 112 is a DRAM (Dynamic Random Access Memory) having memory cells each of which is comprised of one transistor and a capacitor, stores display information corresponding to one frame, and thereby is capable of continuing displaying even when externally writing of display information is discontinued.

In a third conventional technique, a display device uses as one-bit pixel memories semiconductor memories composed of TFTs fabricated on the same substrate and in the same fabrication processes as for pixel-driving TFTS, as disclosed in detail in Japanese Patent Laid-Open Publication No. Hei 8-286,170, for example. FIG. 18 illustrates a configuration of this display device. Pixels 123 are arranged in a matrix fashion in a display region 120, are coupled to a scanning-related circuit 122 via gate lines 126 and ac-driving signal lines 127, and are also coupled to a signal-related circuit 121 via positive-polarity signal lines 124 and negative-polarity signal lines 125. Each of the pixels 123 is provided with a one-bit SRAM (Static Random Access Memory). With this configuration, this liquid crystal display panel is capable of continuing a one-bit image display even when outputting of data to the display section 120 is discontinued.

The memory circuits in the above-described conventional techniques are formed by using Si semiconductor TFTS. In the above conventional techniques, various kinds of memory functions can be incorporated into display devices by using Si semiconductor TFTS, thereby making possible the highly functional display devices and reduction in power consumption.

SUMMARY OF THE INVENTION

In flat panel display devices with built-in display functions and display systems on the same substrate, there is a tendency that the built-in functions and systems are divided between LSI and TFT circuits, and that image display memories such as pixel memories and frame memories are formed of TFTS. A feature of the display devices is that needs arise for reduction in feature sizes for increasing the number of pixels, reduction in area of peripheral regions other than a display region, and low power consumption, and consequently, needs arise for reduction in memory area and power consumption by increasing memory capacities. Further, there is a problem with fabrication processes in that the display devices need to be fabricated at considerably lower processing temperatures than in the case of LSI devices. However, it was difficult for an extension of the above-described conventional techniques to solve all the above problems and to perform multiple-bit image data storage satisfactorily at the same time.

In the first conventional technique employing a Si semiconductor EEPROM which utilizes charge storage, many electric-charge trap levels are present in the insulating layers and polysilicon layers because of low processing temperatures, causing uncertainty in stored information, the variability in performance from TFT to TFT is wider than that within an LSI device, and consequently, there are difficult problems with increasing memory capacities and lowering operating voltages.

In the second conventional technique employing a Si semiconductor DRAM, the number of memory cells increase with increasing number of pixels, and therefore signal voltage swings become very small, and consequently, the signal voltages with lower S/N (Signal-to-Noise) ratios need to be amplified by using high-performance circuits. However, since TFTs are fabricated at lower processing temperatures than LSI circuits, and their feature sizes are large, the performance of TFT circuits are poor, and consequently, it is difficult for the TFT circuits to amplify signal voltages with low S/N ratios accurately. This conventional technique increases complexity of the circuits and power consumption, and a problem arises in that the increase in number of pixels will be limited by the number of memory cells before long.

In the third conventional technique providing an SRAM in each of the pixels, since many transistors are needed for SRAMs, there is a problem in that they necessarily complicate the structure of pixels. The complex pixel structure reduces display brightness because of reduction in the aperture ratio of the pixels. In a case where the third conventional technique is applied to a liquid crystal display device, reduction in power consumption by operating it in the reflective mode is not compatible with high-brightness display by operating it in the transmissive mode. Further, this conventional technique makes it difficult to perform a multiple-bit pixel-data display as by an area-selective gray-scale production method, or to increase image definition.

The above-mentioned problems can be solved by the following techniques:

In accordance with first and second embodiments, in an image display device including a display section having a plurality of pixels arranged in a matrix fashion and each provided with a memory for retaining image data; a signal-related circuit for supplying display signals to the pixels; and a scanning-related circuit for scanning the pixels, the retaining of digital image data in each pixel memory is performed by a memory circuit formed of one or more switches and one memory element, and capable of retaining one-bit data, thereby storing the data in the form of electrical resistance for at least a specified period of time. This memory element can be fabricated by using a low-temperature fabrication method. This makes it possible to fabricate memory circuits in a low-temperature process, to reduce area required for memory functions, and thereby to solve the above-explained problems.

In accordance with third and fourth embodiments, in an image display device including a display section having a plurality of pixels arranged in a matrix fashion; a signal-related circuit for supplying display signals to the pixels; a scanning-related circuit for scanning the pixels; a frame memory for retaining image data; a D/A converter circuit; and a scanning-related circuit for scanning the pixels, the retaining of digital image data in a frame memory is performed by a plurality of memory cells each formed of one or more switches and one memory element, and capable of retaining one-bit data, thereby storing the data in the form of electrical resistance for at least a specified period of time. This memory element can be fabricated by using a low-temperature fabrication method. This makes it possible to fabricate the memory cells in a low-temperature process, to reduce area of the memory cell, and thereby to solve the above-explained problems.

In addition to the above, another of the above-explained problems associated with displaying multiple-bit image data can be solved effectively by using the following technique: Provided in the memory cell or respective pixels for retaining the digital image data is one memory element capable of storing n-bit display data therein in the form of different electrical resistance values corresponding to the n-bit display data, thereby storing the n-bit display data therein in the form of electrical resistances for at least a specified period of time. This memory element can be fabricated by using a low-temperature fabrication method.

This makes it possible to fabricate the memory circuits, memory cells in a low-temperature process, to reduce areas of the memory circuits and memory cells, and thereby to solve the above-explained problems.

BRIEF DESCRIPTION OF THE DRAWINGS

In the accompanying drawings, in which like reference numerals designate similar components throughout the figures, and in which.

DETAILED DESCRIPTION OF THE PREFERRED EMBODIMENTS

FIRST EXAMPLE

A first example in accordance with the present invention will be explained by reference to FIGS. 1 to 5.

Figure 1:
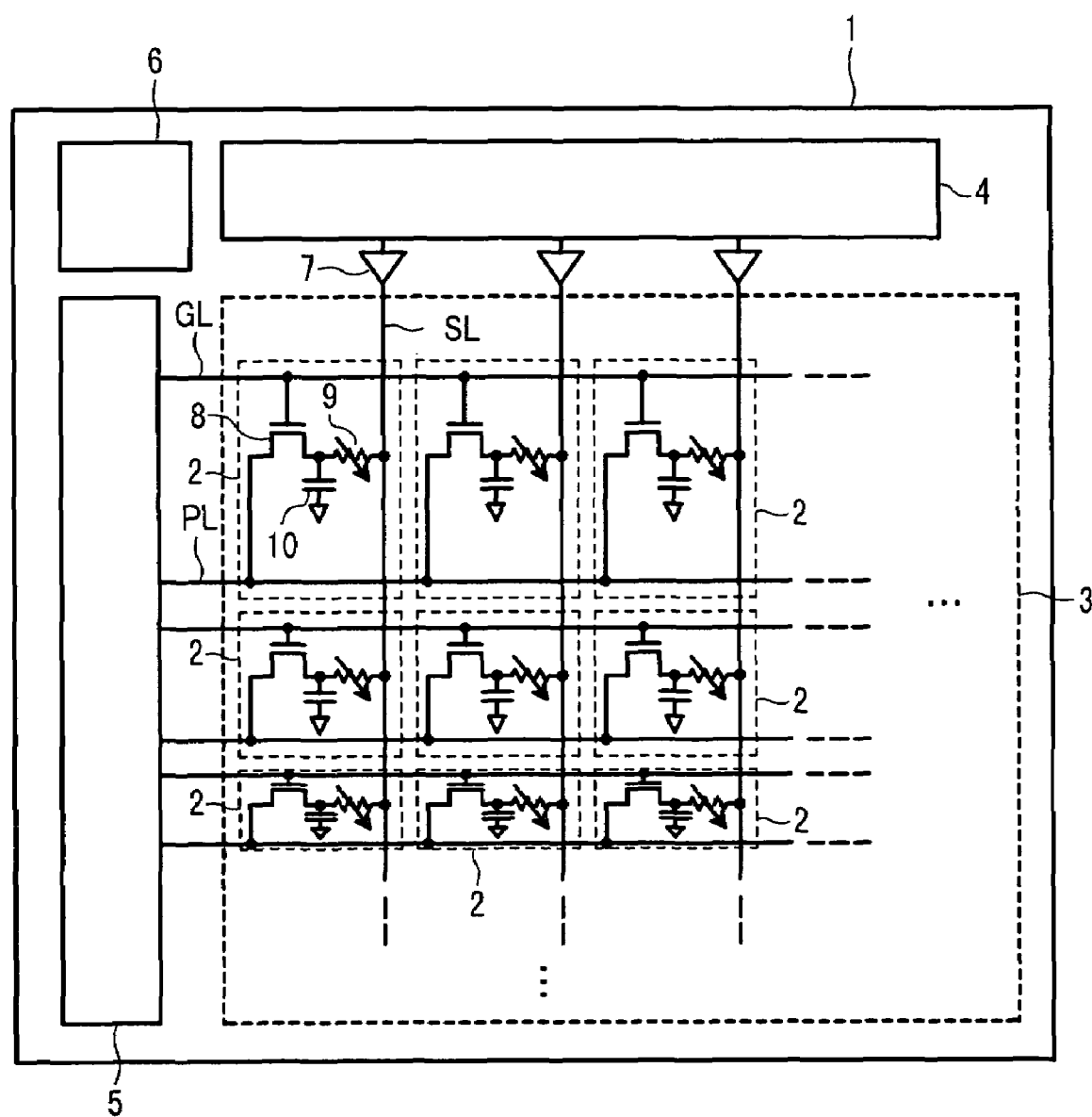
FIG. 1 is an illustration of a configuration of a first example of an image display device in accordance with the present invention.

First, an overall configuration of this example will be explained. FIG. 1 is an illustration of a configuration of a polysilicon TFT display panel provided with pixel memories formed of nonvolatile phase-change type memories which utilize chalcogenide material. This example will be explained with respect to a partially-transmissive type liquid crystal display device which performs two functions of displaying in the transmissive mode using a backlight and of displaying in the reflective mode using ambient light.

In a case where the present invention is applied to a transmissive type liquid crystal display device or a reflective type liquid crystal display device, the layout of its reflective region needs only to be modified according to the particular application.

Further, in a case where the present invention is applied to another type of TFT display device, for example, an organic EL (Electroluminescent) display device, liquid crystal display elements 10 in FIG. 1 need only to be replaced with organic light emitting diodes, and fabrication methods and layouts of TFTs and memory circuits are the same as those in this example.

In FIG. 1, arranged in a matrix fashion are pixels 2 each provided with a memory TFT 8, a memory element 9 and a liquid crystal display element represented by an equivalent capacitance 10 (in order to simplify the diagram, only nine of the pixels 2 are shown in FIG. 1). One terminal of the memory element 9 is connected to a signal line SL. The pixel 2 is coupled to a scanning-related circuit 5 via a gate line GL and a pixel line PL, and is also coupled to a signal-related circuit 4 via the signal line SL and a write circuit 7. In each of the pixels 2, a one-bit image data can be retained by a nonvolatile memory comprised of the memory TFT 8 and the memory element 9. This example provides a liquid crystal display device of an area-selective gray-scale production type in which each of three color pixels for displaying red, green and blue, respectively, is comprised of three pixels different in area from each other, and a total of nine pixels produce a gray scale of a given color.

Figure 2:
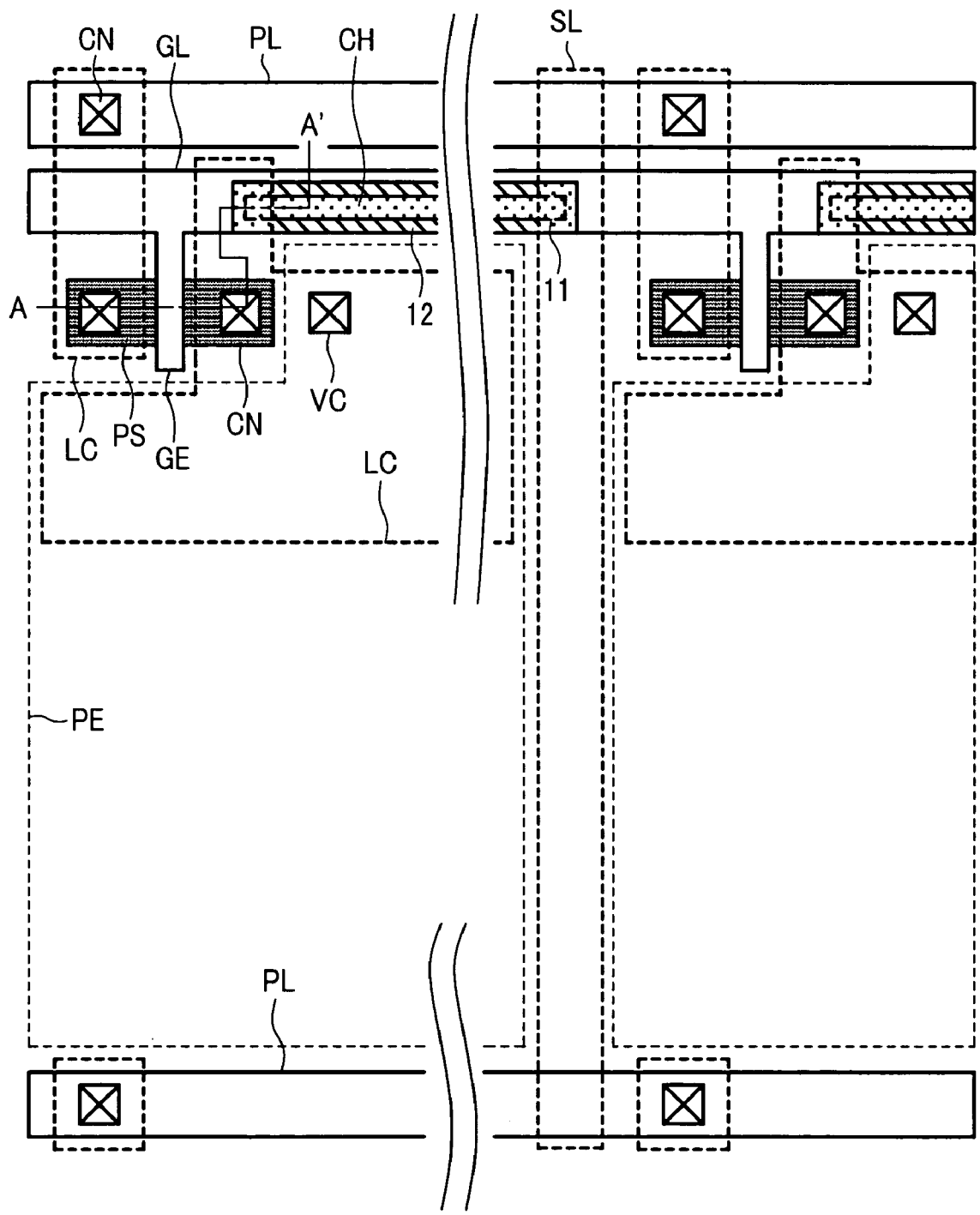
FIG. 2 is a plan view of, pixels in the first example of an image display device in accordance with the present invention.

FIG. 2 is a plan view illustrating a configuration of portions of the pixels 2 shown in FIG. 1. The memory TFT 8 is comprised of a polysilicon layer PS and a gate electrode GE with contact holes CN opened in layers overlying the polysilicon layer PS, and its drain electrode is connected to the memory element 9 and a transparent pixel electrode PE for applying a voltage to a liquid crystal material via a first one of local interconnects LC. This interconnect is increased in area as desired such that it also functions as a reflector. A via VC is an opening for connecting the first local interconnect LC and the pixel electrode PE together. A source electrode of the memory TFT 8 is connected to the pixel line PL via a second one of the local interconnects LC. The gate electrode GE is connected to the gate line GL which is comprised of the same metal layer as that of the gate electrode GE.

The memory element 9 is a variable resistor comprised of a chalcogenide film CH containing at least one element of Te, Se and S and of about 100 nm in thickness, one of its electrodes is connected to the memory TFT 8 via the first local interconnect LC, and the other electrode is connected to the signal line SL. This memory element 9 is capable of converting the chalcogenide film CH into a crystalline state or amorphous state by applying a pulse voltage to it. Usually, a pulse of a high voltage and a short duration (for example, 20 ns) is used to convert the chalcogenide film CH into a high-resistance amorphous state, and a pulse of a low voltage and a little longer duration (for example, 50 ns) is used to convert the chalcogenide film CH into a low-resistance crystalline state. Alternatively, two pulses equal in duration, but different in magnitudes, or two pulses equal in magnitude, but different in duration may be used. Although, in the FIG. 2 plan view, only a portion of the memory element 9 is illustrated for convenience in the drawing, in an actual pixel, the memory element 9 is disposed to extend laterally along one side of the pixel area. In this example, the length of the memory element 9 was selected to be about 20 µm, and the resistances of the memory element 9 in the crystalline and amorphous states were about 100 kΩ and 100 MΩ, respectively.

In the following, the outline of operation of this example will be explained.

The scanning-related circuit 5 opens and closes the memory TFTs in a given pixel row via a corresponding one of the gate lines GL so that image data supplied to the signal lines SL from the signal-related circuit 4 are input into memories each comprised of the memory TFT 8 and the memory element 9 bit by bit, and then the image data are written into the memory elements in the form of resistances by the write circuits 7. Controlling of voltages applied to the liquid crystal material 10 by the image data written into the memory elements 9 can control displaying of an image, that is, transmission and blocking of light. In this case, a full color display is obtained by selecting one from among different combinations of three lighted pixels different in area according to a desired gray scale of a given color.

The following will explain a fabrication method and a cross-sectional configuration of a portion of the memory TFT 8 and the memory element 9 taken along the dash-dot line AA' in FIG. 2, by reference to the fabrication step diagrams of FIGS. 3A to 3E.

Figure 3A:
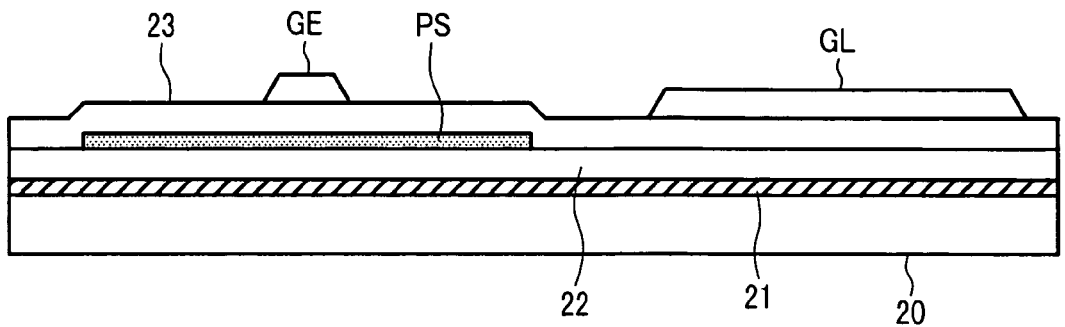
FIGS. 3A to 3E are cross-sectional views illustrating fabrication steps of the pixel in the first example of an image display device in accordance with the present invention.

First, as shown in FIG. 3A, a first passivation film 21 formed of a silicon nitride film or phosphorus-doped silicon dioxide, a silicon oxide film 22, and an amorphous silicon film were deposited on a glass substrate 20 using plasma-enhanced CVD (Chemical Vapor Deposition), and then the polysilicon film PS was obtained by crystallizing the amorphous silicon film using a laser annealing method or a solid phase growth method. As an alternative method for forming the polysilicon film PS, the polysilicon film can be directly deposited on the silicon oxide film 22 using low-temperature CVD. Thereafter, the polysilicon film PS was selectively etched to leave the polysilicon film PS in the form of islands each of which is in a region where a corresponding TFT is to be formed. Next, a gate silicon oxide film 23 was deposited on the silicon oxide film 22 and the islands using plasma-enhanced CVD, then a gate film made chiefly of Mo, for example, was deposited, and was selectively etched to form the gate electrode GE and the gate line GL.

Figure 3B:
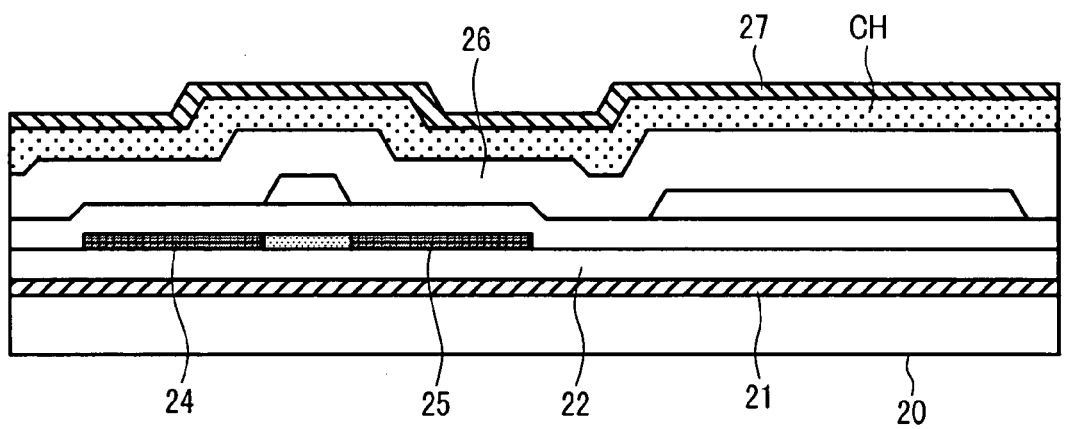

Next, as shown in FIG. 3B, a source diffusion layer 24 and a drain diffusion layer 25 were formed by introduction of impurity ions using ion implantation or ion doping and heat treatment for activation, and then a second passivation film 26 formed of silicon nitride or phosphorus-doped silicon oxide was deposited using CVD. Incidentally, although, for convenience in the diagram, only the cross section of the n-type channel memory TFT is shown, p-type channel TFTs and TFTs employing an LDD (Lightly Doped Drain) structure were formed in the peripheral circuits when necessary in the actual display device. Thereafter, the chalcogenide film CH containing at least one element of Te, Se and S and of about 100 nm in thickness is deposited by sputtering at room temperature or a low temperature close to room temperature, for example. In this example, a material made up chiefly of Zn and Te, for instance, was used as the chalcogenide material. Next, a silicon oxide film 27 was deposited on the chalcogenide film CH. In this case, in order to prevent the chalcogenide film CH from evaporating or deforming when it is made amorphous, a film of 50 nm or more in thickness, and made of $Cr_2O_3$ or other dielectric materials, or a laminated film formed of dielectric and metal films may be deposited on the silicon oxide film 27 by using a sputtering method. Further, the chalcogenide film CH can be crystallized by laser annealing or RTA (Rapid Thermal Annealing), for example, when necessary. Further, these heat treatments can also be utilized as the heat treatment for activating the above-explained impurity ions, at the same time.

Figure 3C:
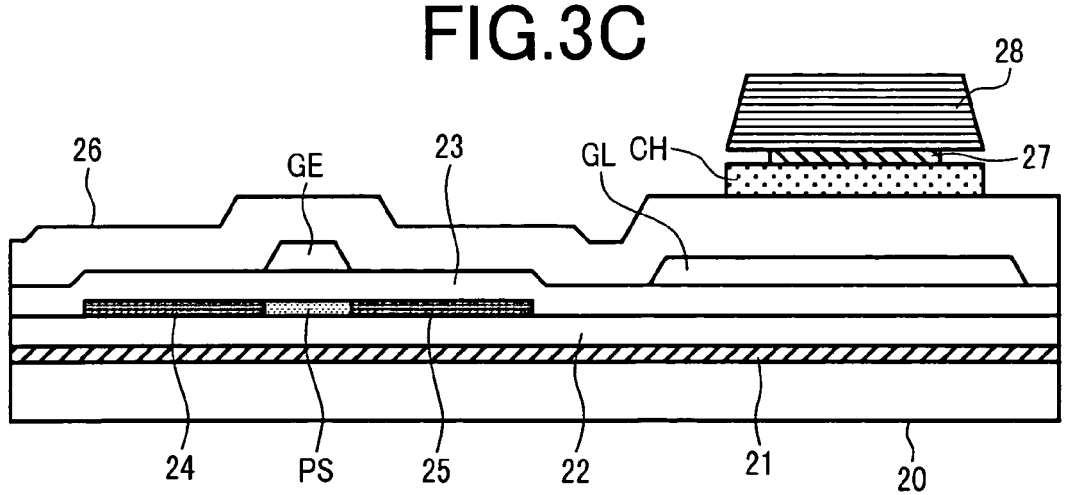

Next, as shown in FIG. 3C, a resist film 28 was left selectively in a region for the memory element 9 to be formed in, by using a lithographic method, and then the chalcogenide film CH was removed selectively by dry etching using the resist 28 as a mask, and then the silicon oxide film 27 was removed selectively by wet etching using the same resist film 28 as a mask. At this time, the edges of the silicon oxide film 27 were recessed from those of the resist film 28 by lateral etching.

Figure 3D:
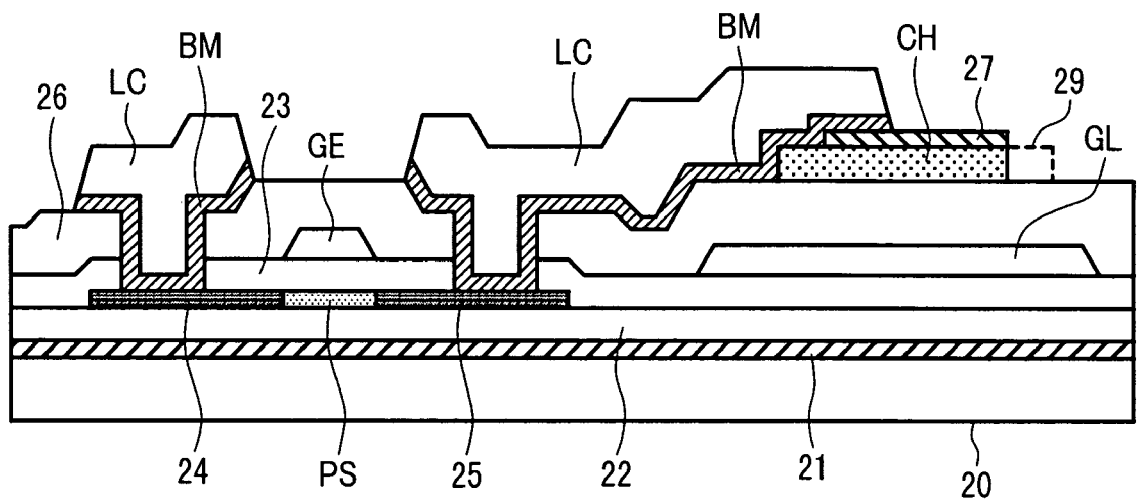

Next, as shown in FIG. 3D, after removing the resist film 28, deposited are a barrier metal film BM made of the same material as that of the gate electrode GE, made chiefly of Mo, for example, and an Al film, or a laminated metal film made up chiefly of Al, such as a laminated film of Al and Ti films, for example, which is used for the local interconnects LC, the signal lines SL and the reflector. The barrier metal film BM can be formed of other metals, W or TiN, for example. Next, laminated metal films other than regions used for the interconnects and the reflector, and the barrier metal film BM were selectively removed by dry etching or wet etching, for example. At this time, regions 29 of the chalcogenide film CH not covered by the silicon oxide film 27 or the interconnect LC were removed by etching simultaneously with the above etching. This silicon oxide film 27 and the interconnect will be explained by reference to the FIG. 2 plan view of the memory element 9. A region where the silicon oxide film remains is a region enclosed by broken lines, and the interconnects are the regions LC and SL indicated by broken lines. That is to say, hatched areas 12 of the chalcogenide film CH were removed simultaneously with the above etching such that a dog-bone-shaped memory element 9 is formed. With this fabrication method, the resistance value of the memory element 9 was determined by a self-aligned process in which the length and width of the resistor (the chalcogenide film CH) are free from influence of registration errors in the lithographic process.

Figure 3E:
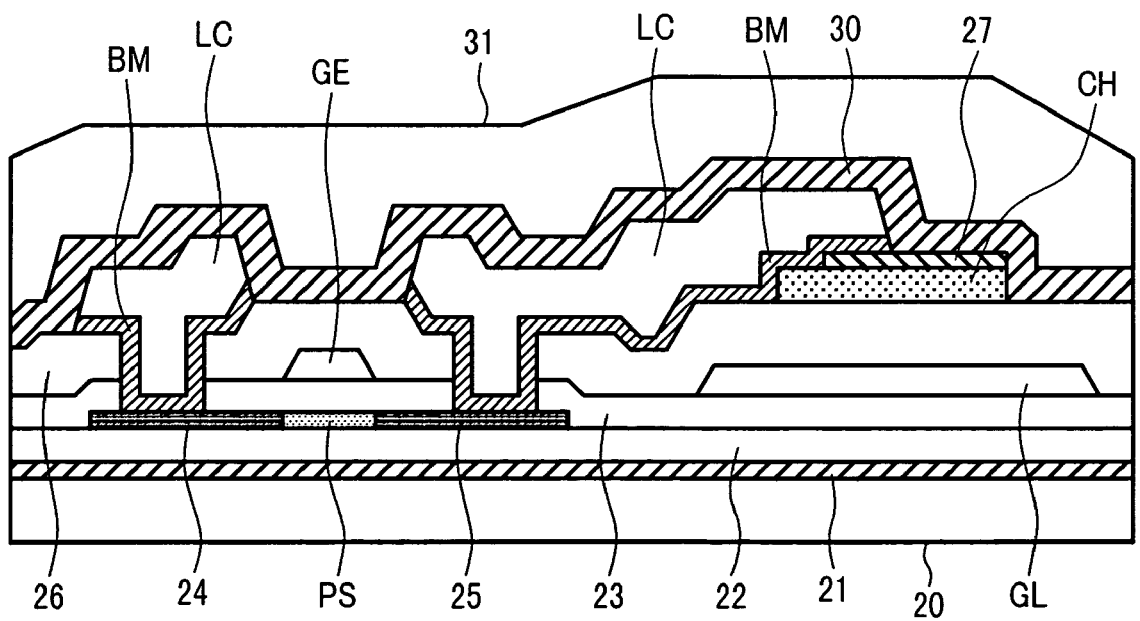

Next, as shown in FIG. 3E, after fabricating the reflector from the same film as the laminated metal layer LC when necessary, deposited were a third passivation film 30 made of silicon nitride or phosphorus-doped silicon oxide film, and a fourth passivation film 31 made of a material low in dielectric constant, for example, an organic material. Thereafter, the processed substrate was subjected to a hydrogenation treatment using hydrogen annealing or plasma processing.

Finally, the via VC shown in FIG. 2 (not shown in FIGS. 3A to 3E) was opened, a transparent electrode film was deposited, and was patterned to provide the transparent electrode PE of the desired shape (not shown in FIGS. 3A to 3E), and thereafter the interconnect layer LC and the transparent electrode PE were connected together. Then, completed after a step of providing liquid crystal material was a liquid crystal display device provided with functions of displaying in both the two transmissive and reflective display modes.

In this example, a glass plate low in heat resistance was used as the substrate, and therefore, in the above-described fabrication processes, all the processing temperatures were selected not to exceed the heat-withstanding temperature of the substrate, 600° C., for example, or when they are selected to be above the heat-withstanding temperature, times for the treatments were limited to very short periods of time in order to prevent occurrence of damages in fabrication.

Further, since the self-alignment process was employed, only one additional lithographic process made it possible to provide the phase-change type pixel memories to the display device, and the resistance value of the memory element 9 could be determined without the influence of registration errors in the lithographic process.

Further, since the chalcogenide film CH was covered with the barrier metal BM and the silicon oxide film 27 not to contact the Al film, the chalcogenide material was not influenced by the Al material. Moreover, the chalcogenide film CH had the structure such that it was sandwiched between the underlying first passivation film 21 and the overlying second and third passivation films 26, 30, which are films capable of excluding influences of mobile ions, such as silicon nitride films or phosphorus-doped silicon oxide films, the memory element was obtained which exhibited a stable resistance value free from the influences of mobile ions. Consequently, while the ON-resistance of the memory TFT was about 500 kΩ, the phase-change type variable resistor serving as the memory element exhibited a high resistance value of about 100 MΩ in the amorphous state, thereby realizing the stable memory operation.

By adopting the above-explained configuration and operation, generation of a display can be continued based on image data retained in memories of respective pixels even when inputting and outputting of image data are discontinued by stopping the operation of the peripheral circuits.

Further, the memories in this example are of the nonvolatile type, and therefore they do not require periodic rewriting of information which is called refreshing. Moreover, since this system continues to apply voltages to the liquid crystal based on the retained data at all times, so-called additional capacitances are not required which retain a liquid crystal display.

Further, in each of the pixels, a combination of one memory TFT 8 and one memory element 9 retains data, the memory element 9 is disposed over a light-blocking region which is called a black matrix and a region including the gate line GL, and therefore an area required for provision of the memory can be reduced. Consequently, a large aperture ratio of each pixel can be obtained while the area of the pixel is reduced, and power consumption of a backlight can be reduced which is needed for displaying in the transmissive mode.

These advantages of the present invention make possible a full-color high-definition display exhibiting gray scales for each color, and also a drastic reduction in power consumption in both the reflective and transmissive mode display operations.

In the above-described example, many changes can be made without departing from the sprit and scope of the present invention. For example, the material for forming the phase-change type variable-resistance memory element 9 is not limited to the material made chiefly of Zn and Te in this example, but a chalcogenide material containing at least one element of Te, Se and S can be used. For example, a material having a composition $Ge_5Sb_2Te_8$ can be used.

Further, if a mixed film of a dielectric substance such as oxide, nitride, sulfide or carbide and a chalcogenide material is provided in at least a portion of the chalcogenide film CH made of the above-mentioned material such that the mixed film intersects a space between the electrodes, that is to say, intersects and thereby blocks an electrically conductive path, when the memory element 9 is set to an initial low-resistance state, a filament-shaped chalcogenide region is formed within the dielectric substance of the mixed film, and serves as a thin conducting path which only passes an electric current, thereby exhibiting a high-resistance value. The preferable dielectric materials include germanium oxide, germanium nitride, silicon oxide, silicon nitride, tantalum oxide, molybdenum oxide, silicon carbide and zinc sulfide. As a typical example, a composition of the chalcogenide: $Ta_2O_5$ ratio of 3:7 increases the resistance by approximately one order of magnitude. In this case, the preferable mixing ratio for the composition is in a range of from 1:9 to 6:4. If the amount of the chalcogenide is greater than this range, the obtained resistance value is smaller than twice that without the $Ta_2O_5$, and on the other hand, the smaller amount of the chalcogenide than the above range makes formation of the filament, an increase in resistance value is smaller than one order of magnitude, which is insufficient.

It is desirable that the mixed film region is disposed in contact with one of the electrodes, but even if the mixed film region is disposed to contact none of the electrodes, a high resistance value can be obtained. In a case where the mixed film region is disposed in contact with one of the electrodes, it is most desirable in view of stability of memory operation that the mixed film region is disposed in contact with a negative-side one of the electrodes because the filament is formed by positive ions. In this case, this configuration is realized by disposing the mixed film region at a position where the chalcogenide film CH and the barrier metal BM contact each other in FIG. 3E.

Further, in this example, the glass substrate 20 was used as the TFT substrate, but a transparent insulating substrate such as a quartz substrate or a transparent plastic substrate can be used instead of the glass substrate. Moreover, this example can be configured exclusively for only one of the two transmissive and reflective type liquid crystal displays, and the present invention can be applied to an organic EL display device by replacing the display section with organic light emitting diodes. As for TFTs, in this example, n-channel type TFTs were used as memory TFTs, but p-channel type TFTs can be used instead, and in a case where the resistance value of the memory elements is selected to be larger, amorphous silicon TFTS can be used as the memory TFTs. The configuration of TFTs is not limited to that in this example, and it is needless to say that the advantages of the present invention are also obtained by using TFTs of a structure in which a gate electrode GE is disposed under a polysilicon region PS, for instance.

SECOND EXAMPLE

In the following, a second example of the present invention will be explained by reference to FIGS. 4 and 5.

This example has increased the resistance value of the memory elements 9 by modifying their layout and cross-sectional configuration in an area-selective gray-scale production and partially-transmissive type liquid crystal display device employing pixel memories of the same phase-change type as in the case of FIRST EXAMPLE.

Figure 4:
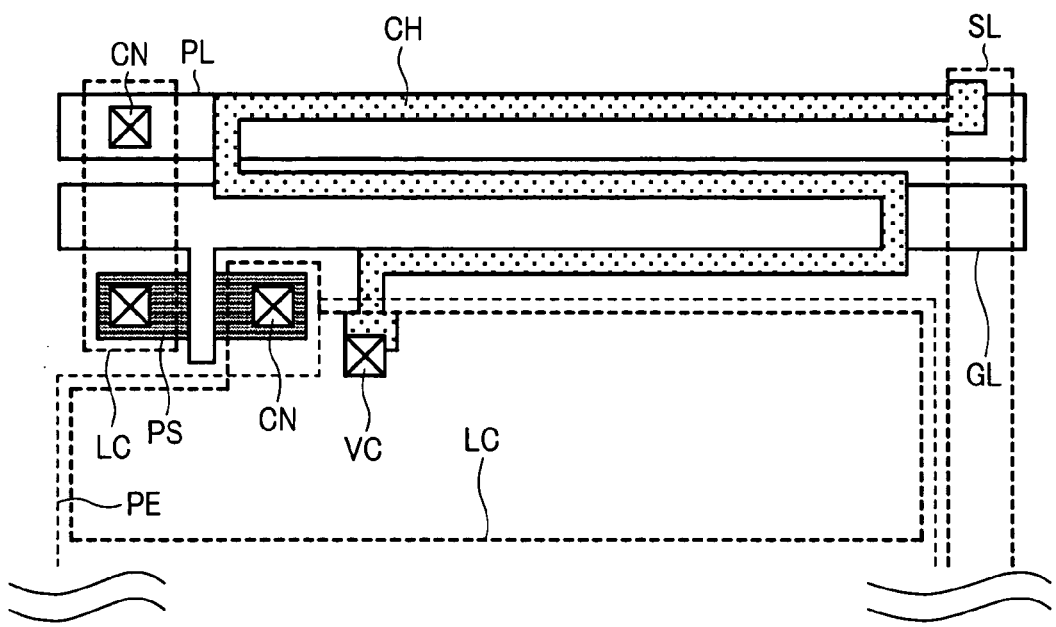
FIG. 4 is a plan view of a pixel in a second example of an image display device in accordance with the present invention.
Figure 5:
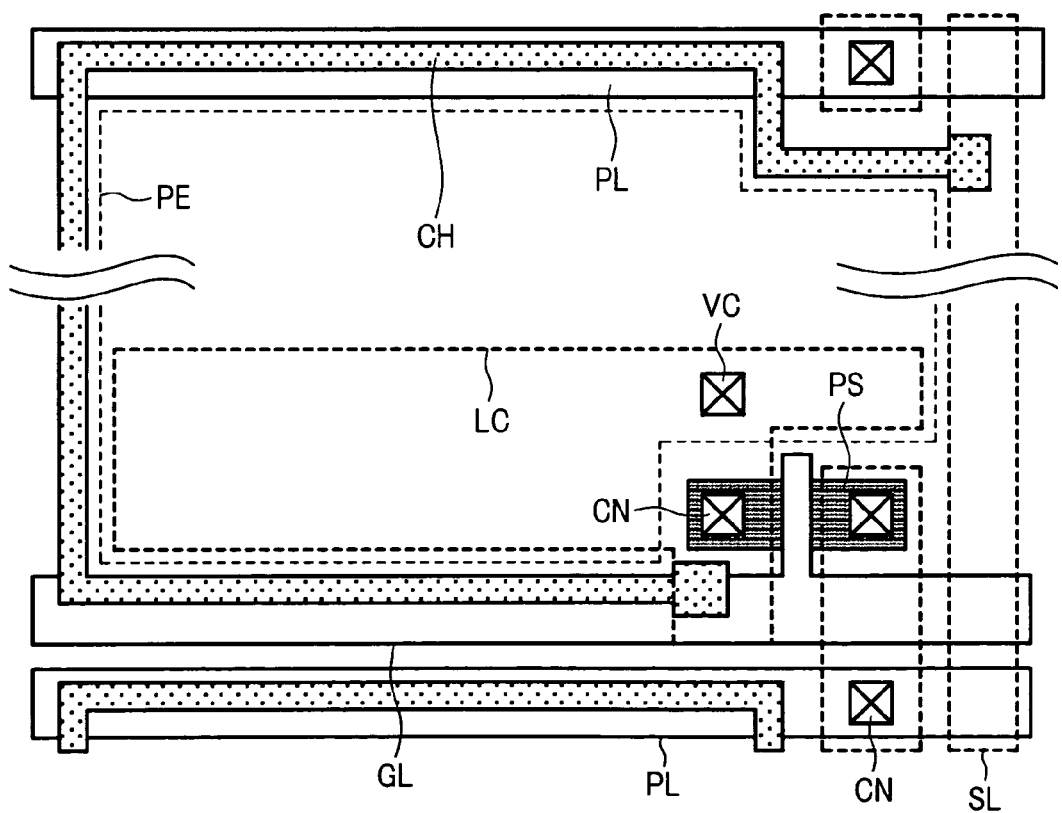
FIG. 5 is a plan view of a pixel in a modification of the second example of an image display device in accordance with the present invention.

FIGS. 4 and 5 are enlarged plan views of the memory element 9 and its vicinities of two modifications, respectively. Actual pixel memory circuits are not limited to that in FIRST EXAMPLE, but other various ones can be employed, and for example, a memory circuit comprised of plural variable-resistance memory elements and plural TFTs can be employed. Since this example is primarily concerned with modifications in structure of the memory element 9, for simplicity, only portions of the pixel memory circuits are shown in FIGS. 4 and 5.

In one modification shown in FIG. 4, the memory element 9 made of the chalcogenide film CH is disposed to extend above the gate line GL and the pixel line PL forming a folded-line structure. This configuration made it possible to increase the length of the resistor by a factor of about three compared with that in FIRST EXAMPLE.

In another modification shown in FIG. 5, the layout of the memory TFT is the same as that in FIRST EXAMPLE, the memory element 9 made of the chalcogenide film CH is disposed to extend along the peripheries of the pixel. This configuration made it possible to increase the length of the resistor by a factor of about three to about four compared with that in FIRST EXAMPLE.

Both these phase-change type resistors are disposed over the light-blocking regions called the black matrix and the regions for the gate lines GL and the pixel lines PL.

Further, the fabrication methods of the TFTs and the memory elements 9 in these modifications are much the same as those in EXAMPLE 1, the thickness of the chalcogenide film CH was made as thin as about 50 nm, and the width of the resistor was decreased to about half that in EXAMPLE 1. With this configuration, the resistance value of the resistor in the amorphous state could be increased to 1 G$\Omega$ or more without increasing an area required for provision of the memory, and the power consumption during displaying based on data retained in the pixel memories could be further reduced.

While, in the above-described modifications, the resistance values were increased by modifying the layouts and cross-sectional configurations of the resistors, the resistance value in the amorphous state can be increased to 10 G$\Omega$ or more by utilizing a chalcogenide material having higher resistivity in the amorphous state, for example.

Further, a high resistance value can be obtained by providing a mixed film of a dielectric substance such as oxide, nitride, sulfide or carbide and a chalcogenide material in at least a portion of the chalcogenide film CH such that the mixed film intersects a space between the electrodes, that is to say, intersects and thereby blocks an electrically conductive path.

It is desirable that the mixed film region is disposed in contact with one of the electrodes, but even if the mixed film region is disposed to contact none of the electrodes, a high resistance value can be obtained. In a case where the mixed film region is disposed in contact with one of the electrodes, it is most desirable in view of stability of memory operation that the mixed film region is disposed in contact with a negative-side one of the electrodes. In this case, this configuration is realized by disposing the mixed film region at a position where the chalcogenide film CH and the local interconnects LC contact each other (in practice, where the barrier metal BM contacts the chalcogenide film CH) in FIGS. 4 and 5.

Further, the write operation can be performed efficiently using a lower voltage with power consumption in the data-retaining state being further reduced by employing a configuration in which the data-retaining resistance provided by the chalcogenide film is selected to be higher than that in this example, Joule's heat-generating resistance elements for changing crystalline states are fabricated from a material other than the chalcogenide material to provide a lower resistance, and the data-retaining high-resistance elements and the Joule's heat-generating low-resistance elements are stacked one on top of another with an electrically insulating thin film therebetween.

THIRD EXAMPLE

In the following, a third example of the present invention will be explained by reference to FIGS. 6 to 10.

Figure 6:
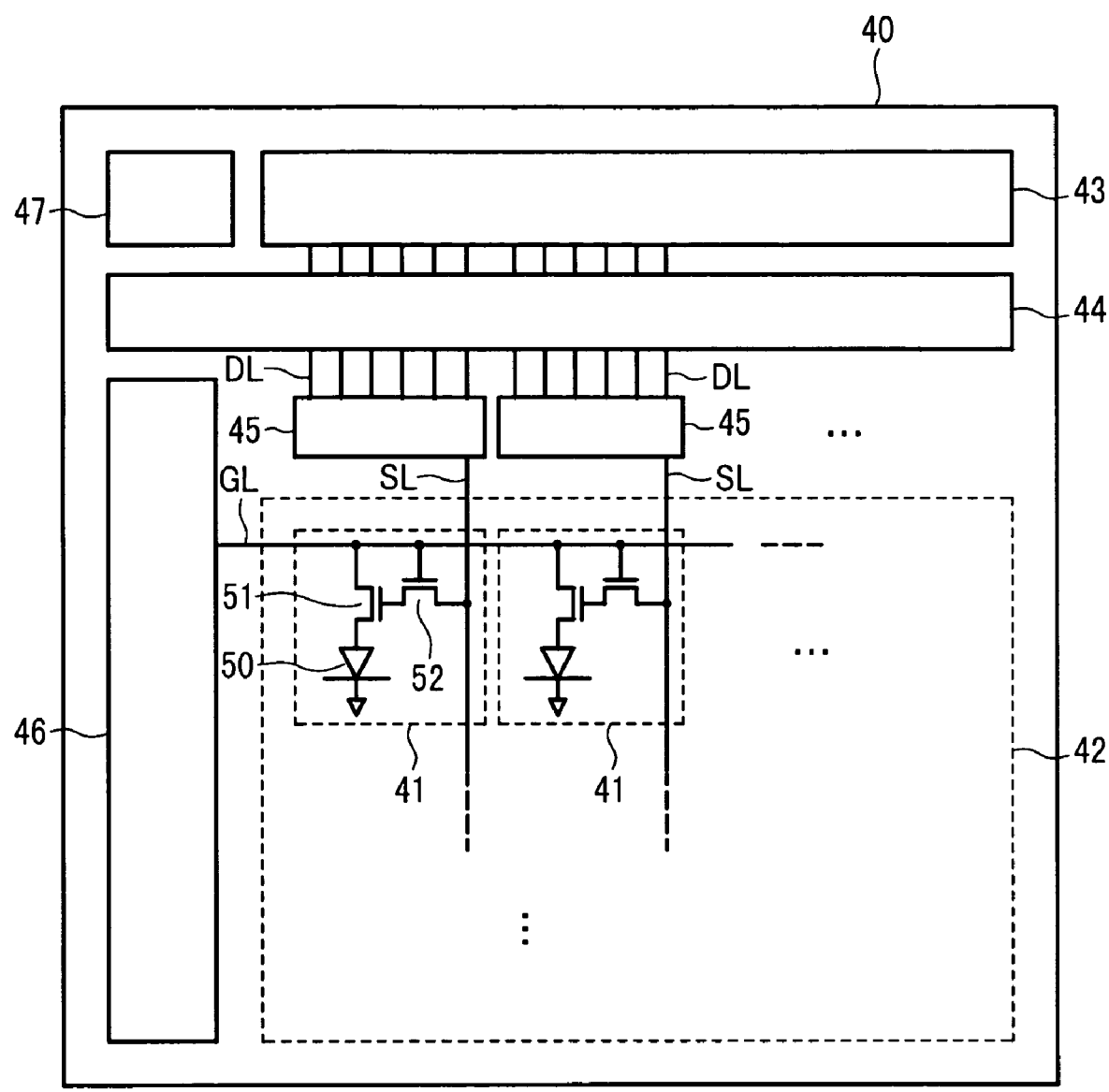
FIG. 6 is an illustration of a configuration of a third example of an image display device in accordance with the present invention.

First, an overall configuration of this example will be explained. FIG. 6 is an illustration of a configuration of a polysilicon TFT display device of this example provided with frame memories formed of nonvolatile phase-change type memories which utilize chalcogenide material. This example will be explained with respect to an organic EL display element providing a six-bit gray scale display. To simplify the figure, only two pixels are shown in FIG. 6, and actual display elements are provided with a plurality of pixels therein corresponding to a desired display definition. Each of pixels 41 is comprised of an organic light emitting diode 50, an organic-light-emitting-diode driving TFT 51, and a pixel TFT 52. The organic light emitting diode 50 is driven by a drive current controlled by a signal voltage written into a gate capacitance of the organic-light-emitting-diode driving TFT 51. With this configuration, this example realizes a light-emissive display device, and can make the display device thinner than liquid crystal display devices because a backlight is not needed. Incidentally, the light emitting diodes used in this example are of the generally known structure, and their structure and others are disclosed in Japanese Patent Application Laid-Open Publication No. 2,001-159,878, for example.

In this example, each of columns of the pixels 41 is provided with a corresponding one of D/A converter circuits 45 and a frame memory 44. The pixels 41 are arranged in a matrix fashion in a display region 42, a gate of a given pixel TFT 52 is coupled to a scanning-related circuit 46 via a corresponding of gate lines GL, one of two terminals of the pixel TFT 52 is coupled to a corresponding one of the D/A converter circuits 45 via a corresponding one of signal lines SL. The D/A converter circuits 45 are connected to the frame memory 44 via data lines DL the other end of which are connected to a signal-related circuit 43.

Figure 7:
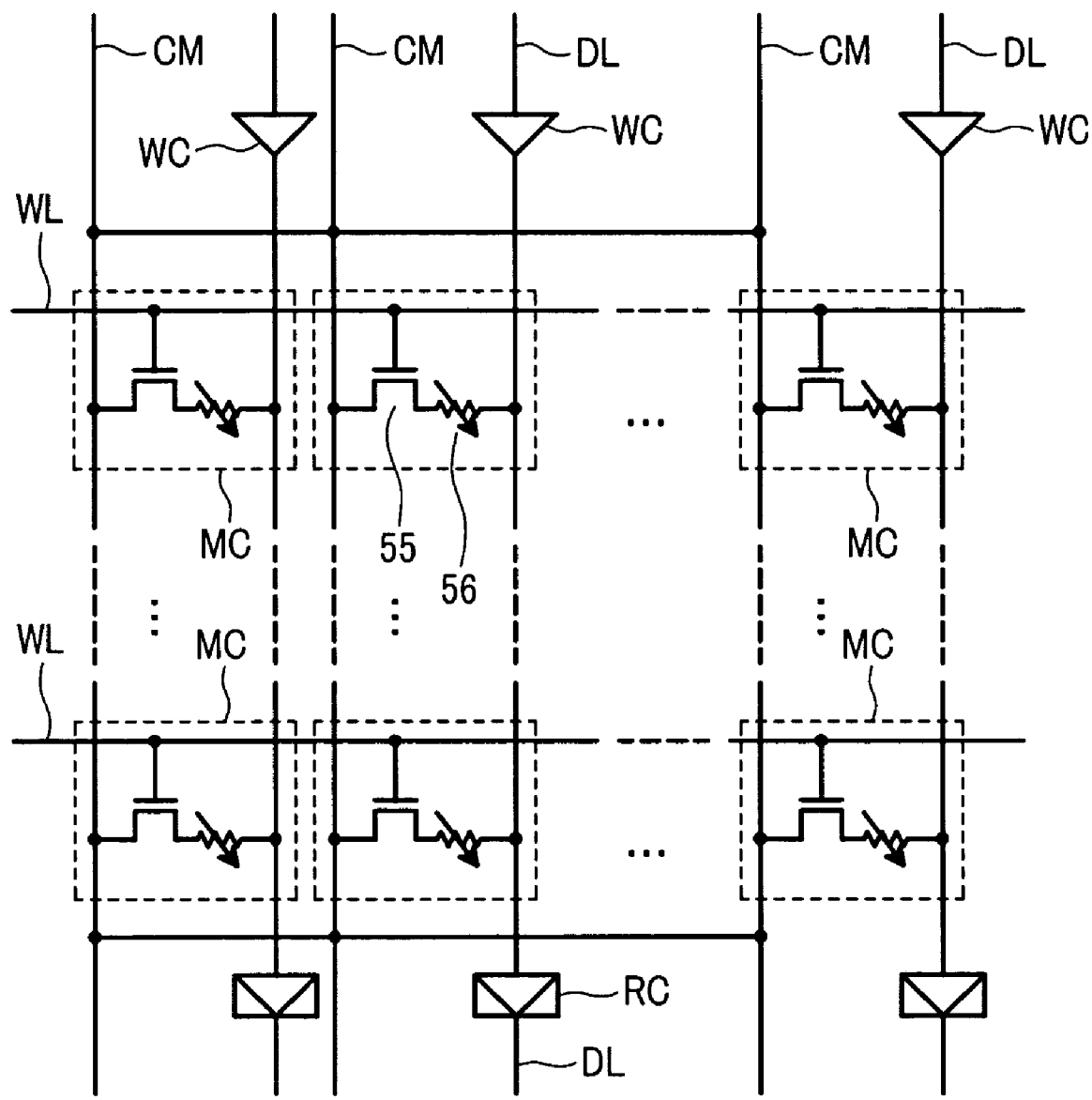
FIG. 7 is an illustration of a configuration of a memory device in the third example of an image display device in accordance with the present invention.

FIG. 7 illustrates a configuration of the frame memory 44. A plurality of memory cells MC are arranged in a matrix fashion in a memory cell array region. In order to simplify the diagram, only some of the memory cells MC are shown in FIG. 7, and in practice, the frame memory 44 is provided with the memory cells MC equal in number to product of the number of rows of the pixels, the number of columns of the pixels, and the number of bits representing a gray scale level. Each of the memory cells MC is a phase change type memory of a one-transistor plus one-memory-element configuration which is comprised of a phase change type variable-resistance memory element 56 made of chalcogenide material and a memory cell TFT 55. Ones of the memory cells MC arranged in the same row are connected to a word line scanning circuit via a corresponding one of word lines WL. One end of the memory element 56 is coupled to a corresponding one of the data lines DL, a source electrode of the memory cell TFT 55 is connected to a corresponding one of common lines CM. The memory cell TFTs 55, the D/A converter circuits 45, the signal-related circuit 43, the scanning-related circuit 46, and a display control circuit 47 are formed on a glass substrate 47 by using polysilicon TFTs.

The following explains operation of this example.

TFTs on a selected one of the word lines WL are made conducting, display data supplied from the data lines DL are written into the memory elements 56 of the memory cells MC in the selected row in the form of electrical resistances by write circuits WC. At this time, currents in the form of a pulse are passed through the memory elements 56 from the write circuits WC to convert the chalcogenide films into a crystalline state or amorphous state. Usually one-bit display data are written by using a pulse of a high voltage and a short duration (for example, 20 ns) to convert the chalcogenide film into a high-resistance amorphous state, and by using a pulse of a low voltage and a little longer duration (for example, 50 ns) to convert the chalcogenide film into a low-resistance crystalline state. In this case, alternatively, two pulses equal in duration, but different in magnitudes, or two pulses equal in magnitude, but different in duration may be used. The above is an operation of writing into the frame memory 44.

Next, the reading operation in this example will be explained. As the word line scanning circuit within the frame memory 44 scan the memory cells MC via the word lines WL, a current path is formed within each of the selected memory cells MC. At this time, resistance values of the memory elements 56 vary depending upon information retained therein, and consequently, voltages output the data lines DL vary according to the retained information. The retained display data are read out by judging the variations of the voltages with read circuits RC, and are supplied to the data lines DL successively. At this time, the display data are entered into the D/A converter circuits 45, which in turn output display voltage signals corresponding to the display data to the signal lines SL.

The scanning-related circuit 46 scans the pixels 41 via the gate lines GL in synchronism with the word line scanning circuit, the pixel TFTs 52 of the thus selected pixels 41 are closed and opened, thereby causing the selected organic light emitting diodes 50 to generate light having gray scale levels in accordance with the display voltage signals. This frame memory is a nonvolatile memory capable of retaining information even when electric power is not supplied, and therefore rewriting operation called refreshing is not required as long as display data remain unchanged. Consequently, this organic EL display device is capable of continuing a display even when externally writing of display data is discontinued.

Figure 8:
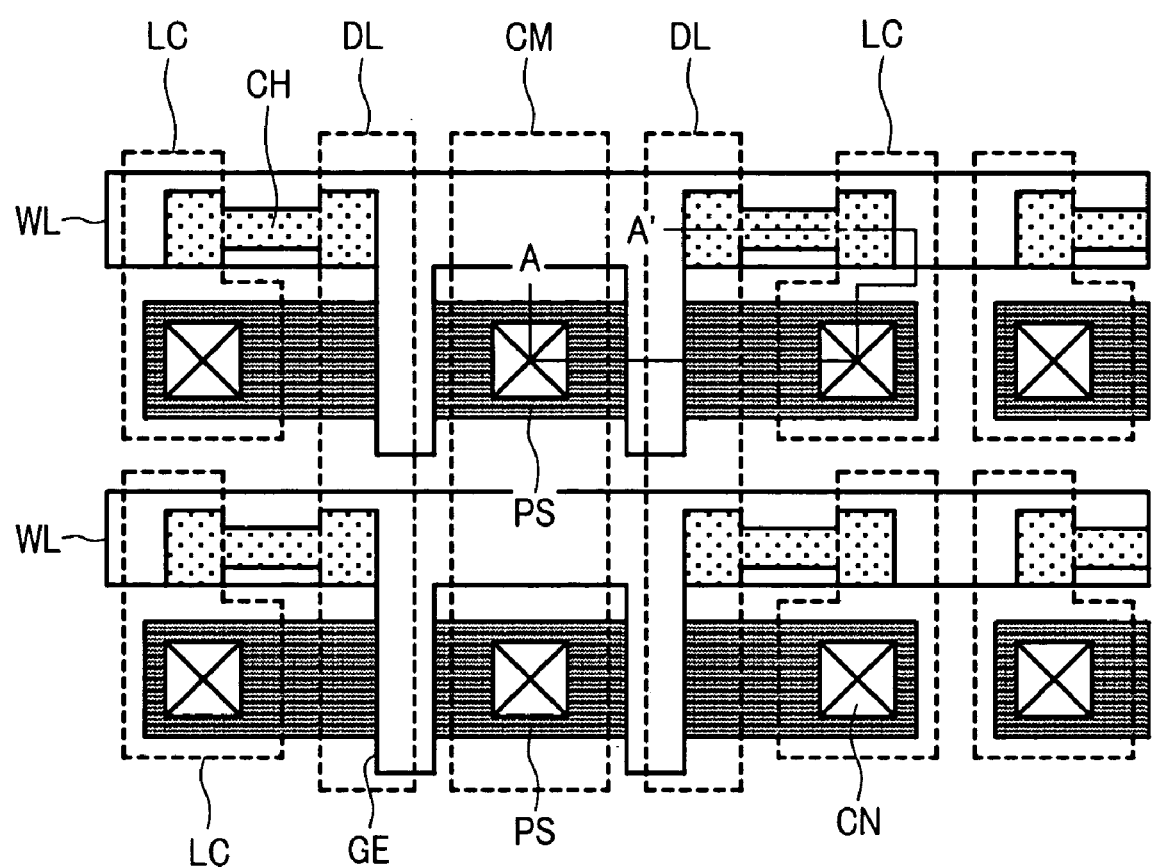
FIG. 8 is a layout of the memory device in the third example of an image display device in accordance with the present invention.
Figure 9:
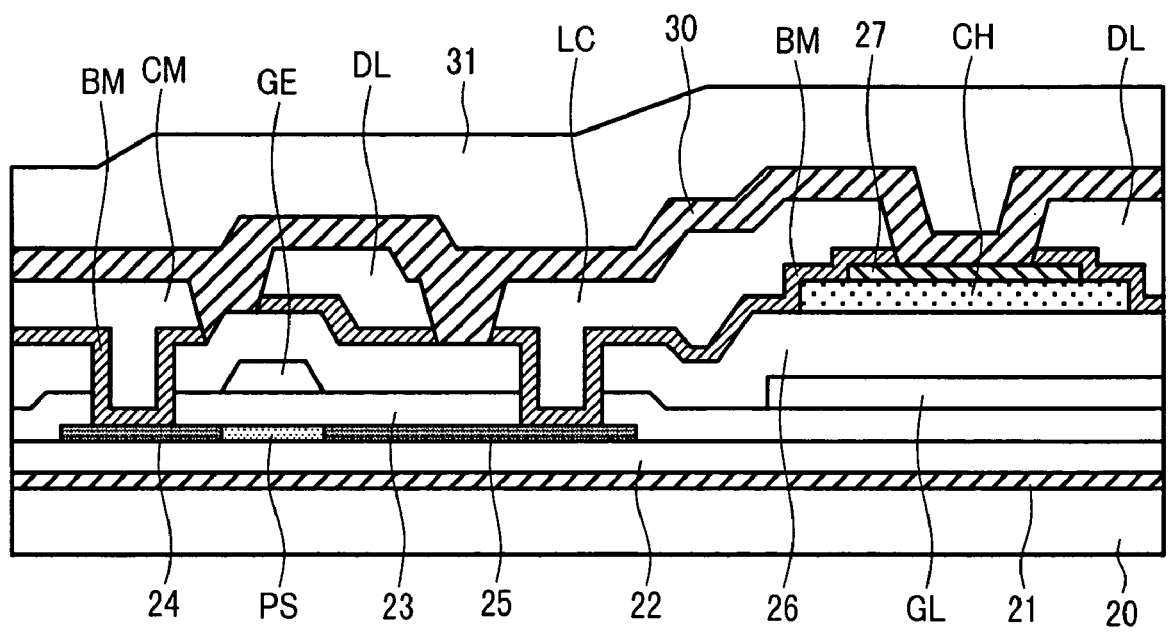
FIG. 9 is a cross-sectional view of the memory device in the third example of an image display device in accordance with the present invention.

In the following, the configuration of the frame memory 44 in this THIRD EXAMPLE will be explained in further detail by reference to FIGS. 8 and 9. FIG. 8 is a plan view illustrating a portion of the cell array of the frame memory 44. FIG. 9 illustrates a cross-sectional configuration of a portion of the memory TFT and the memory element taken along the dash-dot line AA' in FIG. 8. The memory TFT is comprised of a polysilicon layer PS and a gate electrode GE connected to a corresponding one of the word lines WL with contact holes CN opened in layers overlying the polysilicon layer PS, its drain electrode is connected to the chalcogenide film CH forming the memory element with a local interconnect LC, and its source electrode, which is shared by a TFT of an adjacent memory cell, is connected to a corresponding one of the common lines CM. The memory element is disposed over the word line WL, and one of its electrodes is connected to a corresponding one of the data lines DL. The chalcogenide film CH forming the variable-resistance memory element is a film of about 100 nm in thickness, and made of a chalcogenide material containing at least one element of Te, Se and S. In this example, $Ge_5Sb_2Te_8$ was utilized as the chalcogenide material. The length of a portion of the memory element 56 which serves as a resistor is about 2 μm, and its resistance values in the crystalline and amorphous states were about 10 kΩ and about 1 MΩ, respectively. Since the fabrication methods of the TFT and memory element were much the same as those in EXAMPLE 1, their cross-sectional configurations were the same as in EXAMPLE 1, and therefore the same advantages as in EXAMPLE 1 were obtained. That is to say, the employment of a self-aligned process made it possible to determine the resistance value of the memory element without influence of registration errors in the lithographic process.

Further, since the chalcogenide film CH was covered with a barrier metal BM and a silicon oxide film 27, the chalcogenide film CH was configured not to be influenced by an Al material. Moreover, the chalcogenide film CH had the structure such that it was sandwiched between the underlying first passivation film 21 and the overlying second and third passivation films 26, 30, which are films capable of excluding influences of mobile ions, such as silicon nitride films or phosphorus-doped silicon oxide films, the memory element was obtained which exhibited a stable resistance value free from the influences of mobile ions. Consequently, while the ON-resistance of the memory TFT was about 100 kΩ, the memory element exhibited a high resistance value of 1 MΩ or more in the amorphous state, thereby realizing the stable memory operation.

By adopting the above-explained configuration and operation, generation of a display can be continued based on image data retained in the frame memory even when inputting and outputting of image data are discontinued by stopping the operation of the peripheral circuits.

Further, this memory is of the nonvolatile type, and therefore it does not require periodic rewriting of information which is called refreshing. Moreover, since, in this system, Further, a combination of one memory cell TFT 8 and one memory element retains data, the memory element is disposed over a region where the word line WL lies, and as a result an area of the memory cell array can be reduced.

These advantages of the present invention make possible a full-color high-definition display exhibiting gray scales for each color, and also make it possible to reduce power consumption and to realize a display device which has reduced a peripheral frame border around a useful display section on its display panel by reducing an area of its peripheral circuits.

Figure 10:
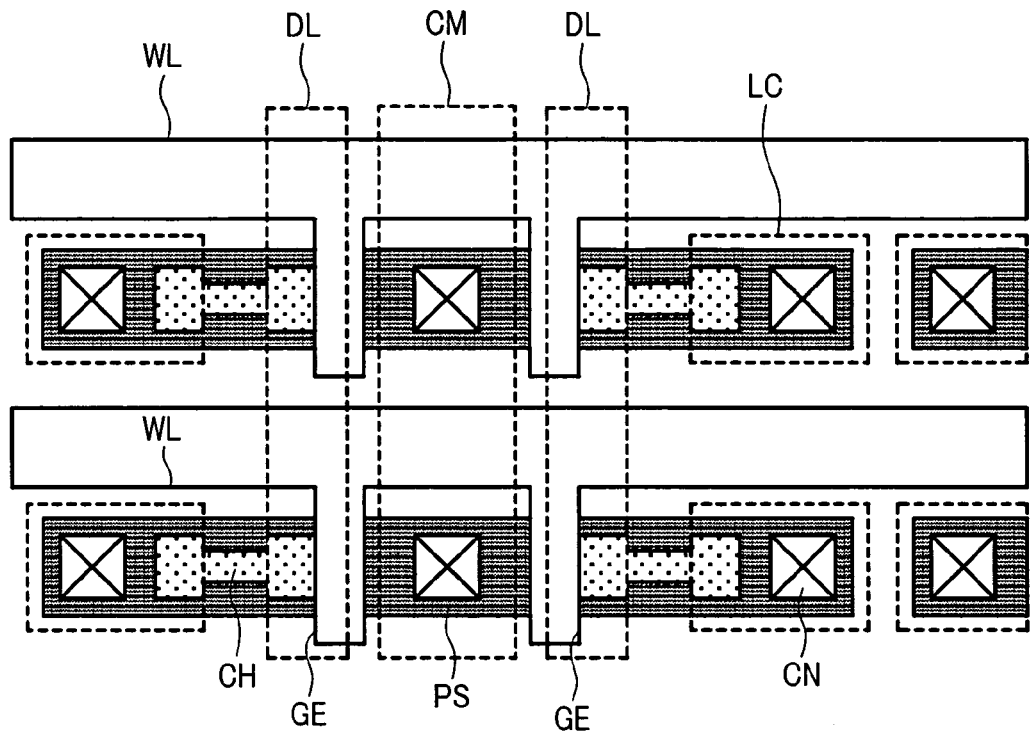
FIG. 10 is a layout of a modification of the memory device in the third example of an image display device in accordance with the present invention.

In the above-described example, many changes can be made without departing from the sprit and scope of the present invention. For example, FIG. 10 illustrates another layout of the cell array of the frame memory different from that of FIG. 8. In this modification, the phase-change type variable-resistance memory elements are disposed over the polysilicon regions PS of the memory cell TFTs. This arrangement can also reduce an area of the memory cell array, and the above-mentioned advantages of the present invention can be obtained.

Further, the material for forming the phase-change type variable-resistance memory element 56 is not limited to the $Ge_5Sb_2Te_8$ composition in this example, but a chalcogenide material containing at least one element of Te, Se and S can be used. For example, a material having a composition GeTe or $Sb_2Te_8$, or a similar composition can be used. As another alternative, a material made chiefly of Zn and Te can be used.

In the case of the material made chiefly of Zn and Te, desirable characteristics are exhibited by a composition composed of Ge or Sb, 40 at. % or more of Te, and 20 to 50 at. % of at least one element selected from among elements belonging to groups 2$b$, 1$b$, 3$a$ to 7$a$ and 8. In particular, Zn is desirable, and Cd provided much the same advantages. The reason why the composition is selected to contain 40 at. % or more of Te, and 20 to 50 at. % of at least one element selected from among elements belonging to groups 2$b$, 1$b$, 3$a$ to 7$a$ and 8 is that high crystallizing temperatures and high electrical resistivity need to be maintained.

The following explains an example of selecting Zn as a representative from among elements belonging to groups 2$b$, 1$b$, 3$a$ to 7$a$ and 8 and selecting Ge as a representative of Ge and Sb. It might be thought that a composition containing a high proportion of Zn maintains a high crystallizing temperature as a whole because the composition forms a structure in which Ge—Te is taken into an amorphous Zn—Te network having strong bonding strength, and their stable crystal systems are different from each other. It is also thought that the addition of Ge enhances its covalent bond tendency compared with that of ZnTe having strong ionicity, thereby making the amorphous network less prone to deformation, and that, once crystallization starts, they are crystallized rapidly due to the domino effect.

In the Ze—Te composition, with the ratio of Zn to Te being fixed, when an addition of Ge or Sb is selected to be in a range of from 5 at. % to 40 at. %, its melting point and crystallizing temperature lowers with as the amount of the addition is increased, and when the amount of the addition was selected to be 40 at. % or less, its amorphous state was stabler than that of $Ge_5Sb_2Te_8$. The addition of 5 at. % or more improved its resistance to oxidation. The amount of the addition was selected to be in a range of from 25 at. % to 35 at. %, especially its resistance to oxidation was enhanced. Further, as a fourth constituent, at least one of Au, Ag and Cu and an element belonging to a group 3 or more can be added in a range of 10 at. % or less.

Further, if a mixed film of a dielectric substance such as oxide, nitride, sulfide or carbide and a chalcogenide material is provided in at least a portion of the chalcogenide film CH made of the above-mentioned material such that the mixed film intersects a space between the electrodes, that is to say, intersects and thereby blocks an electrically conductive path, a high-resistance value can be obtained.

It is desirable that the mixed film region is disposed in contact with one of the electrodes, but even if the mixed film region is disposed to contact none of the electrodes, a high resistance value can be obtained. In a case where the mixed film region is disposed in contact with one of the electrodes, it is most desirable in view of stability of memory operation that the mixed film region is disposed in contact with a negative-side one of the electrodes. In this case, this configuration is realized by disposing the mixed film region at a position where the chalcogenide film CH and the barrier metal BM contact each other in FIG. 9.

Further, in FIG. 9, the glass substrate 20 was used, but a transparent insulating substrate such as a quartz substrate or a transparent plastic substrate can be used instead of the glass substrate.

Moreover, the present invention can be applied to a liquid crystal display device by replacing the display section 42 in FIG. 6 with a liquid crystal type display section. As for TFTs, in this example, n-channel type TFTs were used as memory cell TFTs, but p-channel type TFTs can be used instead, and in a case where the resistance value of the memory elements is selected to be larger, amorphous silicon TFTs can be used as the memory TFTS. The configuration of TFTs is not limited to that in this example, and it is needless to say that the advantages of the present invention are also obtained by using TFTS of a structure in which a gate electrode GE is disposed under a polysilicon region PS, for instance. Further, although the respective circuits are formed of polysilicon TFT circuits in this example, some of these peripheral circuits can be formed of single-crystal LSI (Large Scale Integration) circuits. The scope of the present invention also covers such an alternative modification.

Further, this example is configured such that each of display signals is represented by six bits, but, by increasing the capacity of the frame memory, for example, a display device can be realized which is capable of producing a larger number of gray scale levels.

Further, in a memory cell, a plurality of resistance values can be assigned to crystallizing directions of a material of a memory element, corresponding to the number of bits representing the gray scale levels. This can be carried out by varying a voltage of a crystallizing pulse with a smaller voltage step size to provide a corresponding resistance value.

FOURTH EXAMPLE

Figure 11:
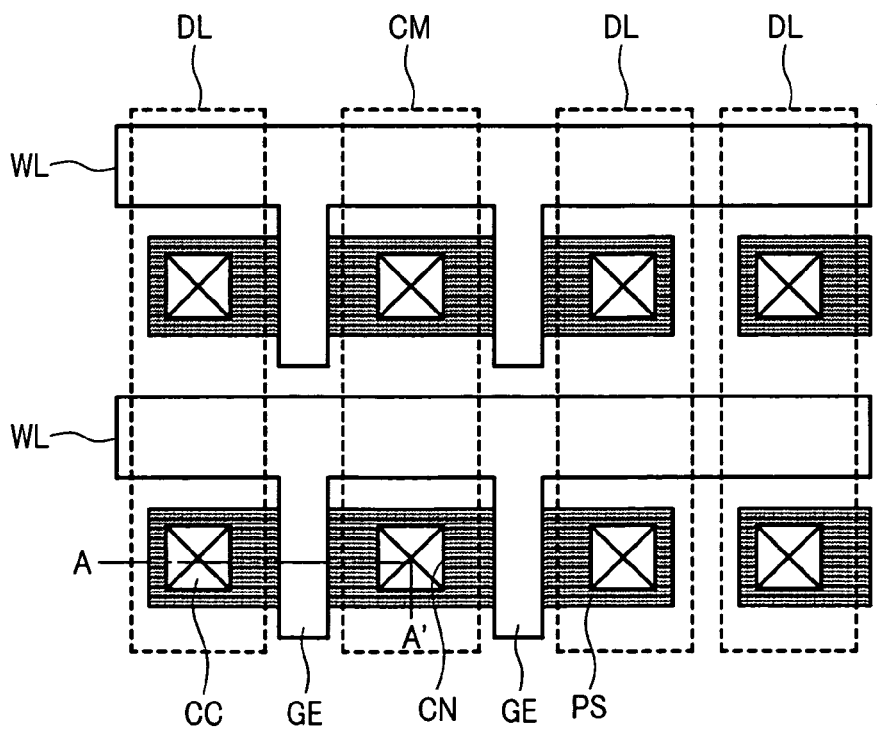
FIG. 11 is a layout of a memory device in a fourth example of an image display device in accordance with the present invention.

In the following, a fourth example of the present invention will be explained by reference to FIGS. 11 to 13.

This example has modified the layout, the cross-sectional configuration and a fabrication method of a memory cell in an organic EL display device employing of the same frame memory as in the case of THIRD EXAMPLE.

The configurations of a display device and a frame memory of this example are similar to those of THIRD EXAMPLE shown in FIGS. 6 and 7, respectively, and a configuration of memory cells of this example is modified from that of THIRD EXAMPLE. FIG. 11 is a plan view illustrating a portion a layout of a memory cell array, and FIGS. 12A to 12E illustrate a cross-sectional configuration of a portion of the memory cell TFT and the memory element taken along the dash-dot line AA' in FIG. 11, and its fabrication method.

In this example, since the memory element formed of the chalcogenide film CH is formed within a contact opening section CC, an area of a one-bit memory cell is equal to that of one memory cell TFT, and as a result, the area of the memory cell array was further reduced.

The following explains the fabrication method of this example.

Figure 12A:
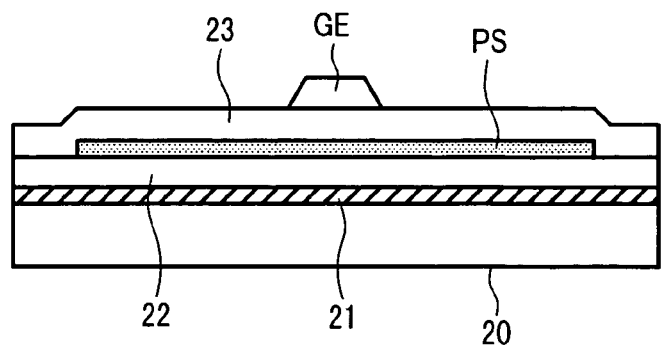
FIGS. 12A to 12E are cross-sectional views illustrating fabrication steps of the memory device in the fourth example of an image display device in accordance with the present invention.
Figure 13:
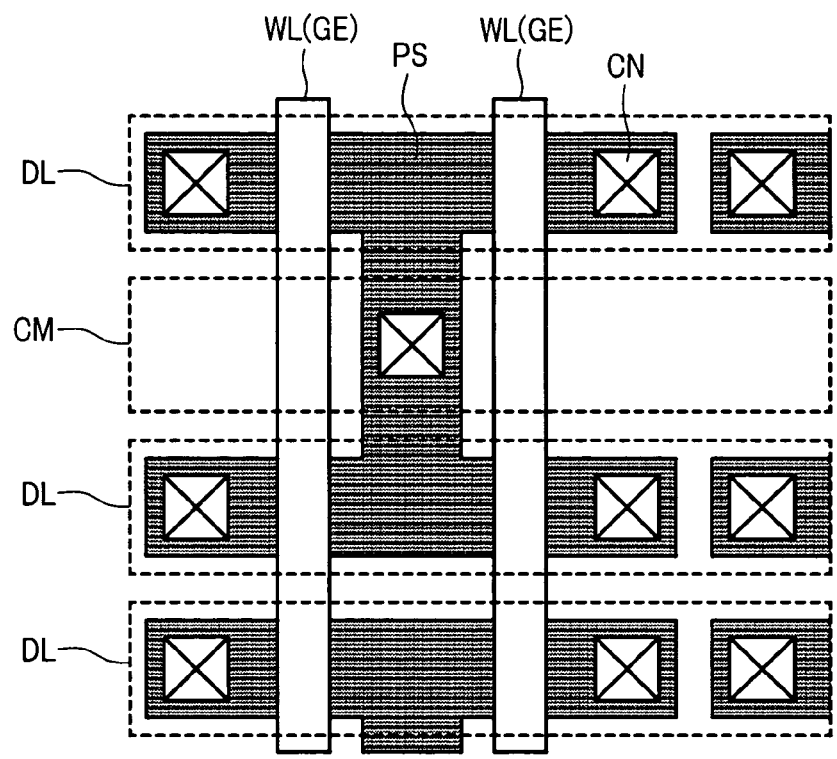
FIG. 13 is a layout of a modification of the memory device in the fourth example of an image display device in accordance with the present invention.

First, as shown in FIG. 12A, a first passivation film 21 formed of a silicon nitride film or phosphorus-doped silicon dioxide, a silicon oxide film 22, and an amorphous silicon film were deposited on a glass substrate 20 using plasma-enhanced CVD, and then the polysilicon film PS superior in crystal perfection was obtained by crystallizing the amorphous silicon film by an annealing method using a pulse-modulated continuous-wave solid-state laser. As alternative methods of forming the polysilicon film PS, amorphous silicon films can be crystallized by using a solid-phase growth method, or a polysilicon film can be directly deposited on the silicon oxide film 22 using low-temperature CVD. Thereafter, the polysilicon film PS was selectively etched to leave the polysilicon film PS in the form of islands each of which is in a region where a corresponding TFT is to be formed. Next, a gate silicon oxide film 23 was deposited on the silicon oxide film 22 and the islands using plasma-enhanced CVD, then a gate film made chiefly of Mo, for example, was deposited, and was patterned to form the gate electrode GE and the gate line GL.

Figure 12B:
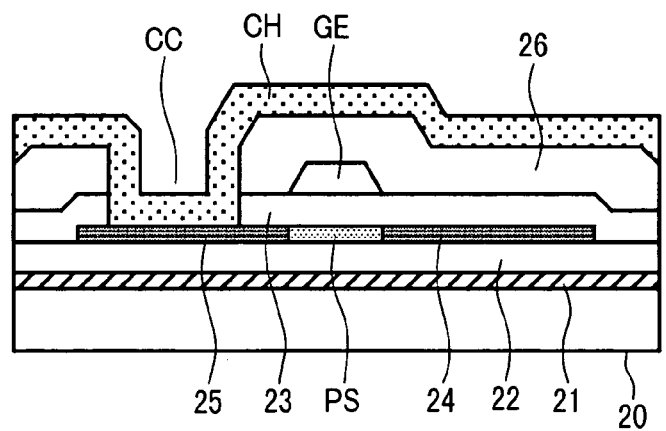

Next, as shown in FIG. 12B, a source diffusion layer 24 and a drain diffusion layer 25 were formed by introduction of impurity ions using ion implantation or ion doping and heat treatment for activation, and then a second passivation film 26 formed of silicon nitride or phosphorus-doped silicon oxide was deposited using CVD. Incidentally, although, for convenience in the diagram, only the cross section of the n-type channel memory TFT is shown, p-type channel TFTs and TFTs employing an LDD structure were formed in other peripheral circuits when necessary in the actual display device. Thereafter, the contact opening section CC was opened in a region for a memory element to be formed in, by using a lithographic method. Next, a chalcogenide film CH of about 200 nm in thickness and made chiefly of Zn and Te, for example, was deposited directly on the polysilicon within the contact opening section CC without any barrier metal being interposed therebetween, by using a low-temperature sputtering method at room temperature or a temperature near room temperature, for example. In this way, if a barrier metal is not interposed, a parasitic low resistance otherwise formed by the barrier metal is not added in parallel with the chalcogenide film, and consequently, the resistance value of the memory element was fabricated with better controllability. At this time, if necessary, the chalcogenide film CH is crystallized by laser annealing or RTA, for instance. Further, these heat treatments can also serve as a heat treatment for the above-mentioned activation of impurity ions.

Figure 12C:
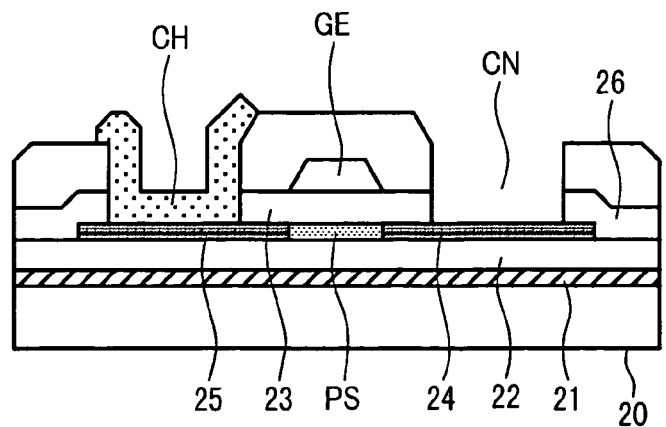

Next, as shown in FIG. 12C, the chalcogenide film CH was selectively etched to leave a chalcogenide film CH in a region where the memory element is to be formed, by using a lithographic method, and then a contact hole CN for the TFT was opened by using a lithographic method.

Figure 12D:
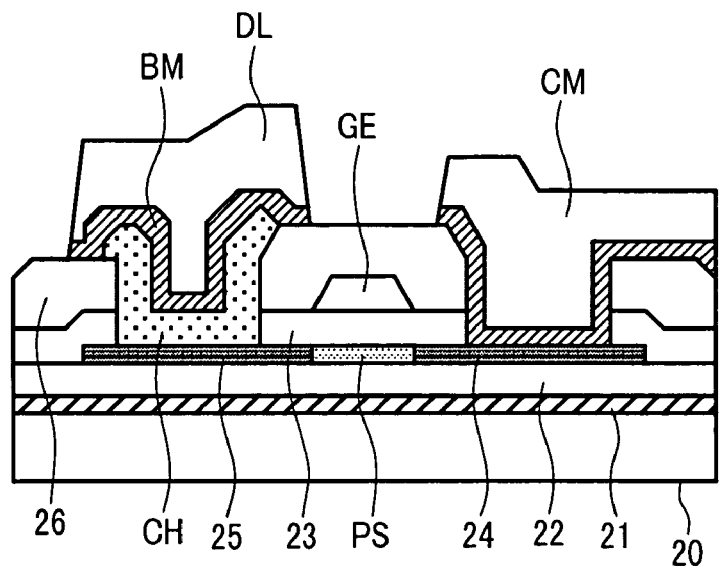

Next, as shown in FIG. 12D, after depositing a barrier metal BM made chiefly of Mo, for example, and an Al film used for data lines DL and common line CM or a metal laminate film made chiefly of Al such as a laminate film of Al and Ti, for instance, they were patterned. The barrier metal film BM may be formed of other materials, W or TiN, for example.

With this fabrication method, the length of the resistance and the cross-sectional area of the memory element are determined by the thickness of the chalcogenide film and the area of the opening in the contact opening section CC for the memory element, and consequently, the resistance value was determined by a self-aligned process without influence of registration errors in the lithographic process. At this time, in order to prevent the chalcogenide film from evaporating or deforming when it is made amorphous, a film of 50 nm or more in thickness and made of $Cr_2O_3$ or other dielectric materials may be deposited by using a sputtering method.

Figure 12E:
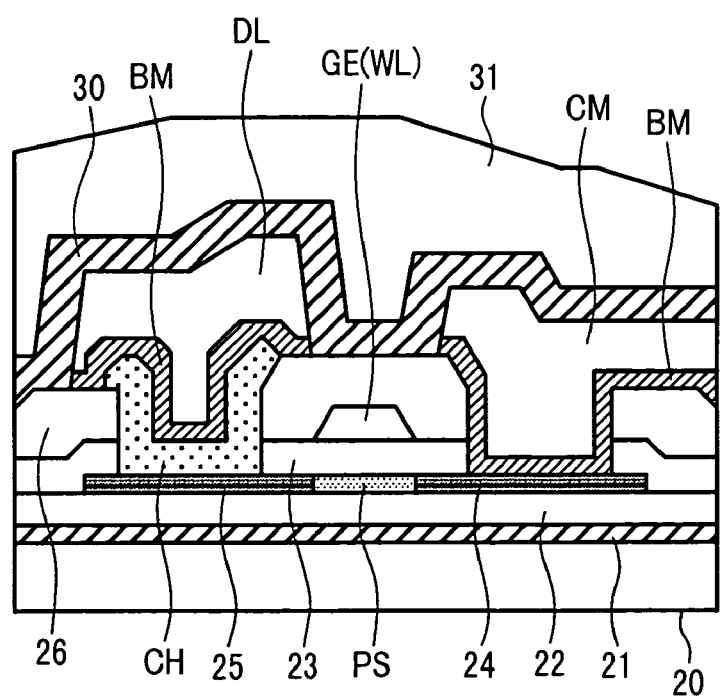

Next, as shown in FIG. 12E, deposited were a third passivation film 30 made of silicon nitride or phosphorus-doped silicon oxide film, and a fourth passivation film 31 made of a material low in dielectric constant, for example, an organic material. Thereafter, the processed substrate was subjected to a hydrogenation treatment using hydrogen annealing or plasma processing.

Finally, a via VC (not shown in FIGS. 12A to 12E) was opened in a display region, a transparent electrode film was deposited, and was patterned to provide the transparent electrode of the desired shape (not shown in FIGS. 12A to 12E), and thereafter the interconnect layer and the transparent electrode were connected together. Then, the organic EL display device was completed after being subjected to a step of fabricating organic light emitting diodes.

With this fabrication method, the resistance value of the memory element was determined with good controllability by a self-aligned process without influence of registration errors in the lithographic process.

Further, since the chalcogenide film CH was covered with the barrier metal BM, the chalcogenide film CH was configured so as not to be influenced by the Al material. Moreover, since the chalcogenide film CH had the structure such that it was sandwiched between the underlying first passivation film 21 and the overlying second and third passivation films 26, 30, which are films capable of excluding influences of mobile ions, such as silicon nitride films or phosphorus-doped silicon oxide films, the memory element was obtained which exhibited a stable resistance value free from the influences of mobile ions. In this case, this memory element has exhibited the resistance of 1 MΩ or more in the amorphous state. In this example, on the other hand, since the memory cell TFT was fabricated by using the polysilicon film PS superior in crystal perfection, the ON-resistance of the memory cell TFT could be reduced to about 20 kΩ. In this way, a difference between the resistance of the memory cell and the ON-resistance of the memory cell TFT was made stably large, and as a result the stable memory operation was realized.

By adopting the above-explained configuration and operation, generation of a display can be continued based on image data retained in the frame memory even when inputting and outputting of image data are discontinued by stopping the operation of the peripheral circuits.

Further, this memory in this example is of the nonvolatile type, and therefore it does not require periodic rewriting of information which is called refreshing.

Further, in this system, a combination of one memory cell TFT and one memory cell retains data, an area occupied by the combination is equal to that of one TFT, and consequently, the area occupied by the memory cell array can be reduced.

These advantages of the present invention make possible a full-color high-definition display exhibiting gray scales for each color, and also make it possible to reduce power consumption and to realize a display device which has reduced a peripheral frame border around a useful display section on its display panel by reducing an area of its peripheral circuits.

In the above-described example, many changes can be made without departing from the sprit and scope of the present invention. For example, FIG. 13 illustrates another layout of the memory cell array of the frame memory different from that of FIG. 11. In this modification, the word lines WL and the gate electrodes GE were made of the same metal film, and the lines DL and the common lines CM are made of interconnect layers made chiefly of Al. This arrangement also makes possible reduction in the area of the memory cell array, and provides the similar advantages.

The material for forming the phase-change type variable-resistance memory element 56 is not limited to the material made chiefly of Zn and Te in this example, but a chalcogenide material containing at least one element of Te, Se and S can be used. For example, a material having a composition $Ge_5Sb_2Te_8$ can be used.

Further, if a mixed film of a dielectric substance such as oxide, nitride, sulfide or carbide and a chalcogenide material is provided in at least a portion of the chalcogenide film CH made of the above-mentioned material such that the mixed film intersects a space between the electrodes, that is to say, intersects and thereby blocks an electrically conductive path, a high-resistance value can be obtained.

It is desirable that the mixed film region is disposed in contact with one of the electrodes, but even if the mixed film region is disposed so as to contact none of the electrodes, a high resistance value can be obtained. In a case where the mixed film region is disposed in contact with one of the electrodes, it is most desirable in view of stability of memory operation that the mixed film region is disposed in contact with a negative-side one of the electrodes. In this case, this configuration is realized by disposing the mixed film region at a position where the chalcogenide film CH and the barrier metal BM contact each other in FIG. 12E.

Further, in FIGS. 12A to 12E of this example, the glass substrate 20 was used as the TFT substrate, but a transparent insulating substrate such as a quartz substrate or a transparent plastic substrate can be used instead of the glass substrate.

Moreover, the present invention can be applied to a liquid crystal display device by replacing the display section 42 in FIG. 6 with a liquid crystal type display section. As for TFTs, in this example, n-channel type TFTs were used as memory cell TFTs, but p-channel type TFTs can be used instead, and in a case where the resistance value of the memory elements is selected to be larger, amorphous silicon TFTs can be used as the memory TFTs. The configuration of TFTs is not limited to that in this example, and it is needless to say that the advantages of the present invention are also obtained by using TFTs of a structure in which a gate electrode GE is disposed under a polysilicon region PS, for instance. Further, although the respective circuits were formed of polysilicon TFT circuits in this example, some of these peripheral circuits can be formed of single-crystal LSI circuits. The scope of the present invention also covers such an alternative modification.

Further, this example is configured such that each of display signals is represented by six bits, but, by increasing the capacity of the frame memory, for example, a display device can be realized which is capable of producing a larger number of gray scale levels.

Further, in a memory cell, a plurality of resistance values can be assigned to crystallizing directions of a material of a memory element, corresponding to the number of bits representing the gray scale levels. This can be carried out by varying a voltage of a crystallizing pulse with a smaller voltage step size to provide a corresponding resistance value.

FIFTH EXAMPLE

Figure 14:
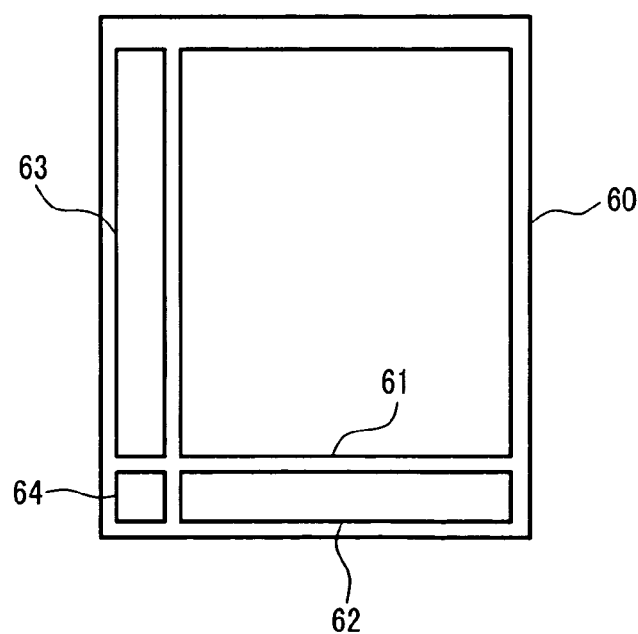
FIG. 14 is an illustration of a configuration of a fifth example of an image display device in accordance with the present invention.

In the following, a fifth example of the present invention will be explained by reference to FIG. 14. In this example, the present invention was applied to a mobile phone and a digital still camera. FIG. 14 illustrates a configuration of a display device employed in this example. This display device is an area-selective gray-scale production and partially-transmissive type liquid crystal display device having a display section 61 of about 2 to 3 inches in diagonal, and display definition approximately to QVGA (Quarter-Video Graphics Array, 320×240 pixels), and employing six-bit data for each primary color, and provided with pixel memories formed of nonvolatile phase-change type memories. A display control circuit 64 includes circuits necessary for displaying an image, such as a image-data input circuit, a power supply voltage conversion circuit, a level shift circuit, and a timing control circuit. Data output from the display control circuit 64 are transferred to a signal-related circuit 62 which includes a shift register circuit, a buffer circuit and the like, and to a scanning-related circuit 63, and thereby an image is produced. These circuits are formed of polysilicon TFTs, the TFTs and the phase-change type memory elements were fabricated on the same glass substrate 60, and as a result the width of a peripheral frame border around the display section could be reduced, and consequently, the display device superior in design could be provided. Incidentally, some of the peripheral circuits may be formed of LSI circuits.

The display device is operated in the transmissive mode using a backlight as a light source mainly, for watching moving pictures distributed by the Internet or the terrestrial digital broadcasting, or using as the video telephone. In this case, since this display device is capable of adopting a large aperture ratio, the power consumption could be reduced.

On the other hand, the display device is operated mainly in the reflective mode, for waiting to be called, or for watching the same still image for a long period of time. In this case, the generation of a display can be continued based on information retained in the pixel memories even when inputting and outputting of image data are discontinued by stopping the operation of the peripheral circuits, and therefore a full-color image of gray scale levels represented by six-bit data for each primary color was obtained with the power consumption being greatly reduced to about 2 mW or less.

SIXTH EXAMPLE

Figure 15:
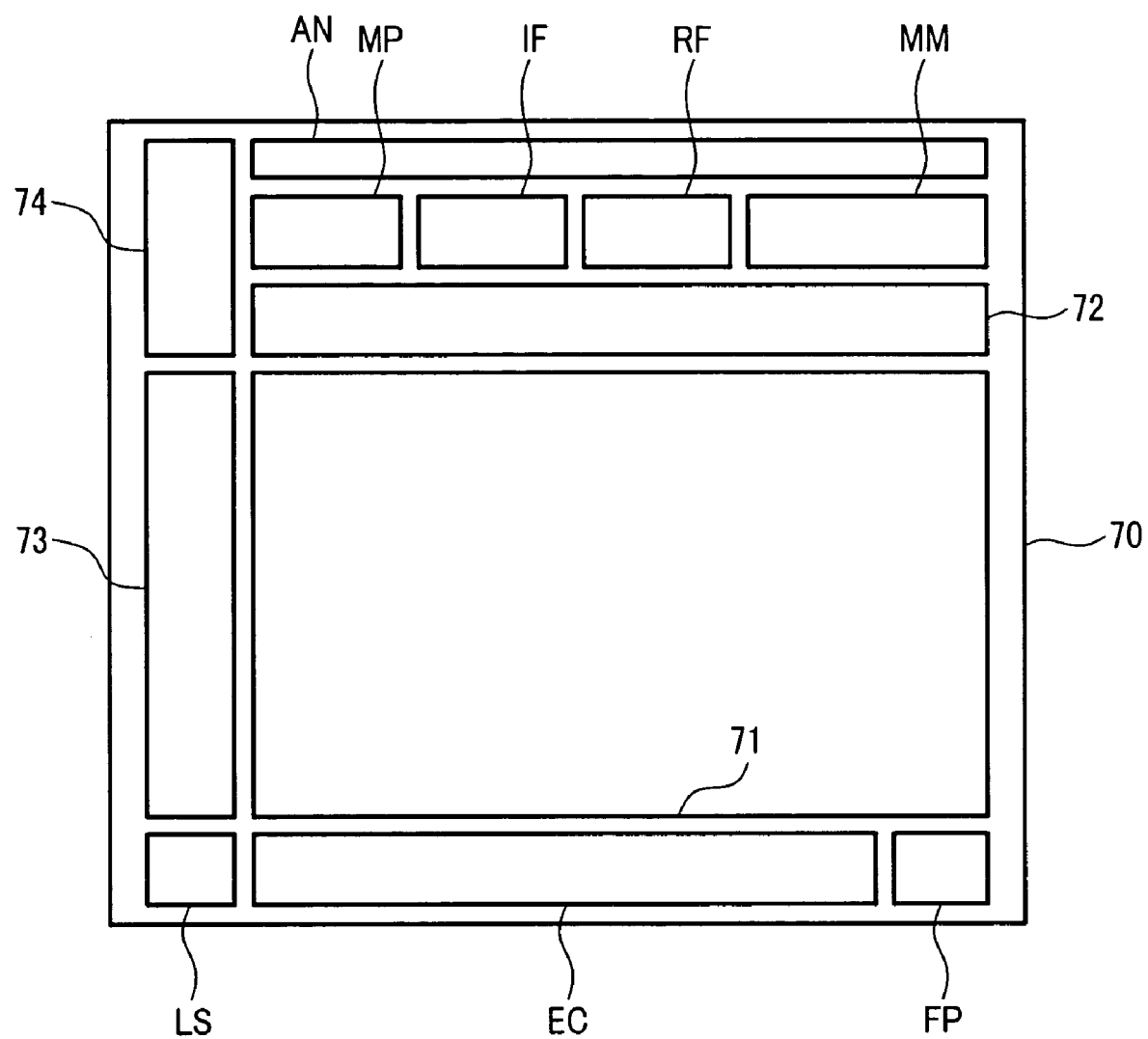
FIG. 15 is an illustration of a configuration of a sixth example of an image display device in accordance with the present invention.
Figure 16:
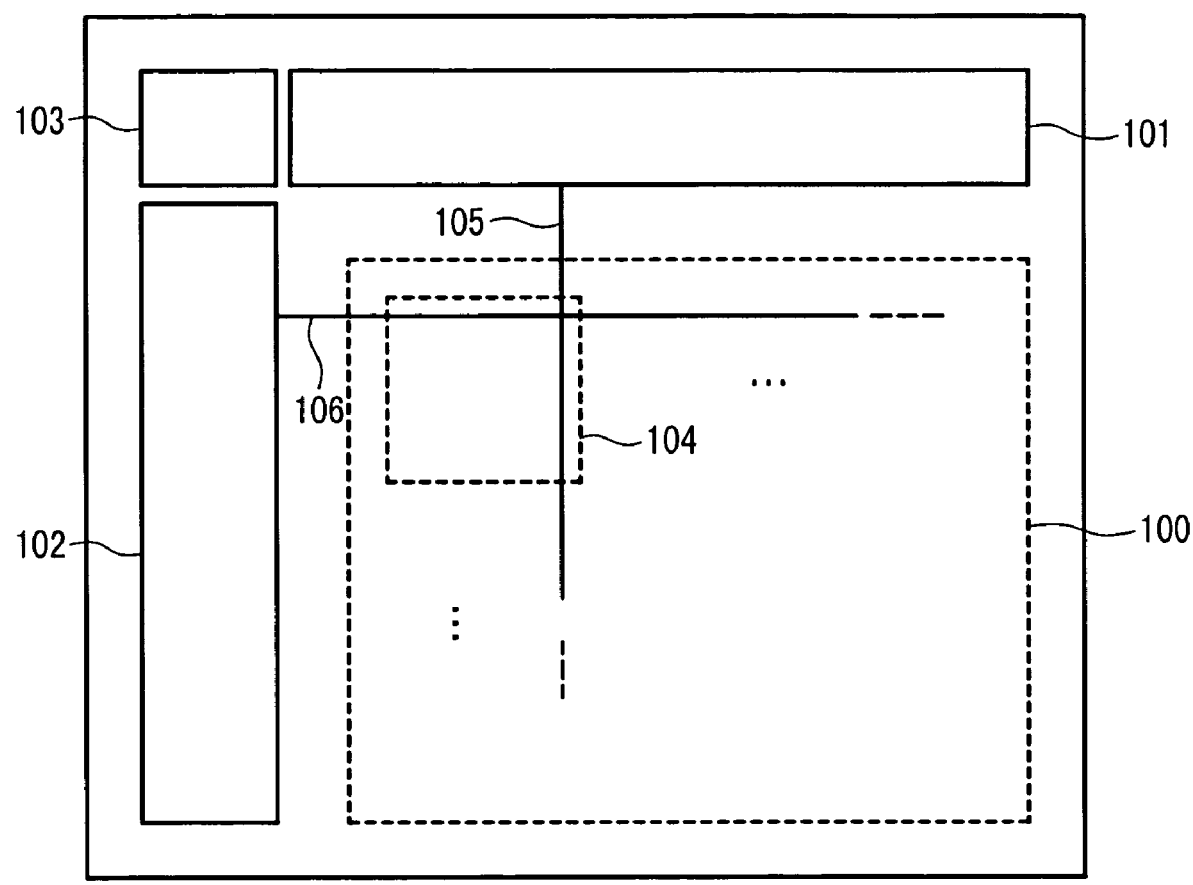
FIG. 16 is an illustration of a configuration of a first conventional image display device.
Figure 17:
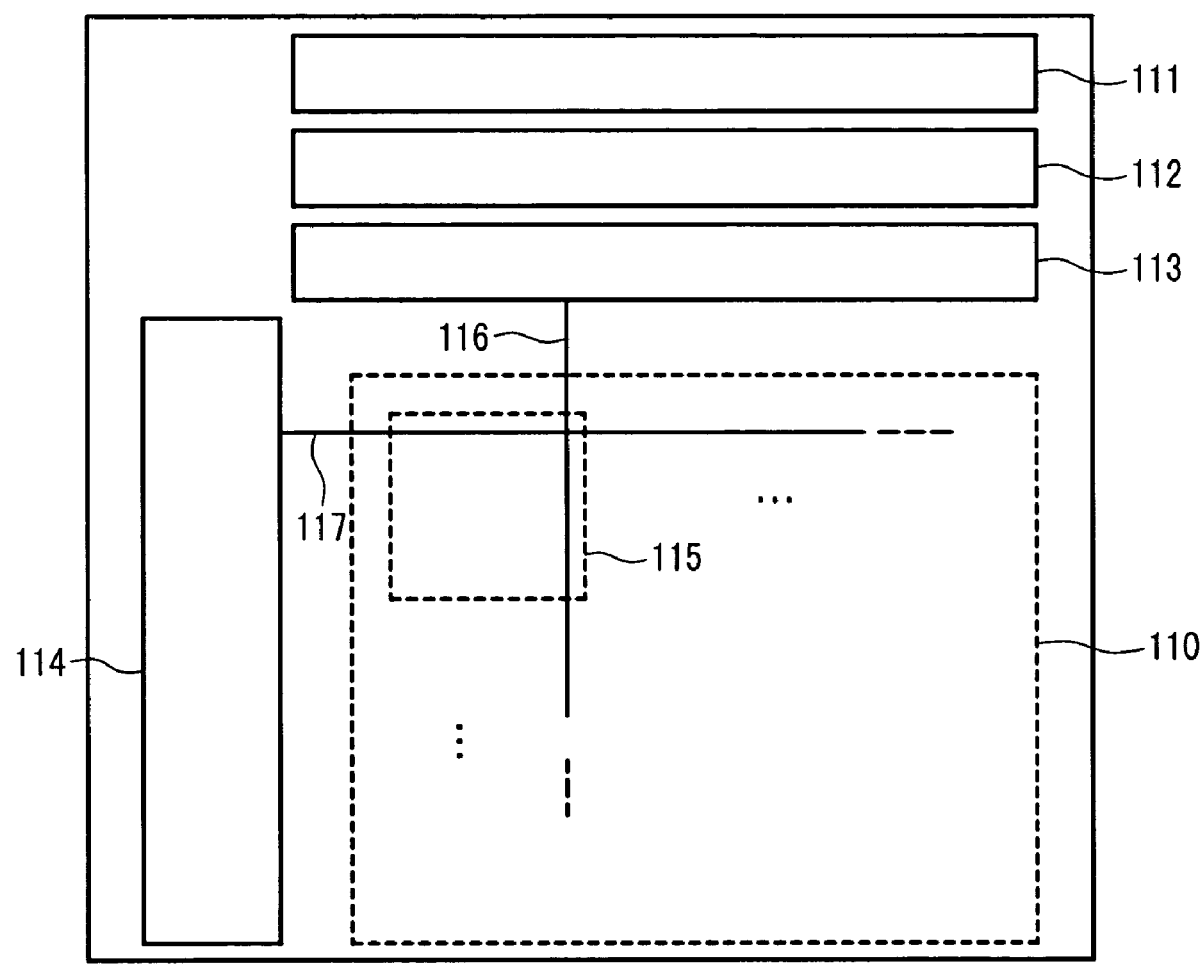
FIG. 17 is an illustration of a configuration of a second conventional image display device.
Figure 18:
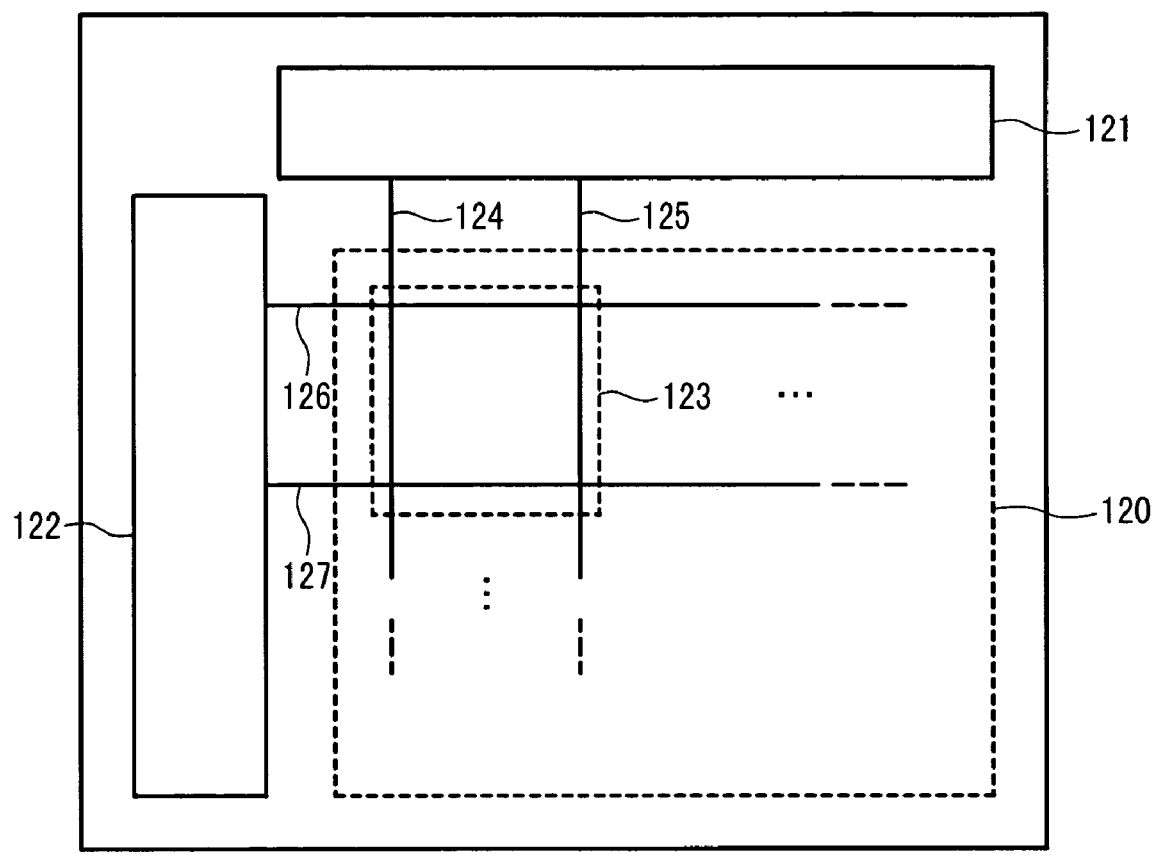
FIG. 18 is an illustration of a configuration of a third conventional image display device.

In the following, a sixth example of the present invention will be explained by reference to FIG. 15.

In this example, the present invention was applied to a portable information service terminal. FIG. 15 illustrates a configuration of a display device employed in this terminal.

This display device is a light-weight thin organic-EL display device having a display section of about 5 to 10 inches in diagonal, and display definition approximately in a range of from SVGA (Super-Video Graphics Array, 800× 600 pixels) to UXGA (Ultra-Extended Graphics Array, 1,600×1,200 pixels), and employing six-bit gray-scale data for each primary color, and provided with a frame memory formed of nonvolatile phase-change type memories in a signal-related circuit 72.

In addition to the above, mounted on the display device are a wireless communication circuit RF, an interface circuit IF, a microprocessor MP, a general-purpose memory MM, an antenna AN, an external-light sensor circuit LS, an energy control circuit EC including a solar cell, and a personal identification sensor circuit FP and others, incorporating high functions in the display device. These circuits are composed of polysilicon TFTs and LSI circuits. The polysilicon TFTs, the phase-change type memory elements, the antenna, the respective sensors and the solar cell were fabricated on the same glass substrate 70 by using low-temperature processes at 600° C. or below, the LSI chip was mounted directly on the glass substrate, and as a result the width of a peripheral frame border around the display section could be reduced, and consequently, the display device superior in design could be provided.

Further, although the general-purpose memory MM was formed of an LSI circuit in this example, it may be formed of nonvolatile phase-change type memory as in the case of the frame memory, for instance.

In this way, since the TFT circuits, the phase-change type memory elements, the antenna, the sensors and the solar cell were fabricated on the same glass substrate 70, and also the number of LSI chips to be mounted was reduced, the display device superior in resistance to shock was obtained in spite of its light weight and thinness.

In the following, a method of displaying image data will be explained briefly. The wireless communication circuit RF includes a low-noise amplifier circuit, a high-output amplifier circuit, an inductor, a capacitor and others, and will receive compressed image data and others from the outside by wireless. The image data are transferred to the microprocessor MP via the interface circuit IF. After being subjected to required processes in the microprocessor MP, the image data are transferred to a display control circuit 74 including circuit functions for displaying an image, such as a power supply voltage conversion circuit, a level shift circuit and a timing control circuit, the signal-related circuit 72 including the frame memory, and a scanning-related circuit 73, thereby displaying an image.

This information service terminal makes it possible to observe images provided by the Internet or an information distribution service spot, or to utilize image information. Particularly, in a case where still images or videotex information is used which provides photographs, news, various kinds of guides, shopping information, maps, or local news, the generation of a display can be continued based on image information retained in the frame memory even when the operation of the peripheral circuits, the microprocessor MP and the wireless communication circuit RF is stopped, and therefore a full-color image of gray scale levels represented by six-bit data for each primary color can be obtained with the power consumption being reduced.

Further, the power consumption for displaying can be reduced by sensing ambient light using the external-light sensor circuit LS and thereby optimizing display luminance.

Further, this information service terminal can be used for various kinds of reservations, shopping, or receiving services from a bank with its user being identified by the personal identification sensor circuit FP.

Further, if a function of a touch panel is imparted to at least a portion of the display section of this information service terminal, inputting of data or instruction can be made by touching a keyboard displayed on the display section with a pen or fingers. In this case, if at least two kinds of keyboard displays are provided which are different from each other at least in the arrangement of keys and the size of the keyboards, and are either single-handed or double-handed, the user can choose one among them.

This example has been explained with respect to an organic EL display device, but it is needless to say that the advantages of the present invention are obtained even when the present invention is applied to other types of display devices such as the transmissive type liquid crystal display device.

The present invention is capable of increasing the number of pixels of an image display device, reducing an area of peripheral regions other than a display section, and reducing power consumption at the same time. Further, the present invention is capable of displaying plural-bit image data.

What is claimed is:

1. An image display device comprising a display section comprised of a plurality of pixels; and a control section which controls said display section, wherein said image display device includes a nonvolatile phase-change type memory device having a memory for image display which is comprised of phase-change device elements and TFTs each having only a drain electrode connected to a corresponding one of the phase-change device elements, and said nonvolatile phase-change type memory device is comprised of at least one variable-resistance memory element and at least one TFT, wherein said at least one variable-resistance memory element is comprised of a chalcogenide material containing at least one element of Te, Se and S, and wherein a resistance of said at least one TFT in a conducting state thereof is in a range of from 10 kΩ to 500 kΩ and a resistance of said at least one variable-resistance memory element in a high-resistance state thereof is 1000 kΩ or more.

2. An image display device according to claim 1, wherein said at least one variable-resistance memory element is fabricated by using a lithographic method, and is free from variations in resistance value due to registration errors of masks.

3. An image display device according to claim 1, wherein said at least one variable-resistance memory element is covered with a material other than Al such that said at least one variable-resistance memory element is not in direct contact with an Al material.

4. An image display device according to claim 1, wherein said at least one variable-resistance memory element is sandwiched in a direction of a thickness thereof and protected by a plurality of protective films capable of suppressing influences of mobile ions.

5. An image display device according to claim 1, wherein each of said plurality of pixels has a function which retains display data therein.

6. An image display device according to claim 1, wherein said nonvolatile phase-change type memory device is included in said control section, and serves as a frame memory which retains display data for one frame.

7. An image display device according to claim 1, wherein said display section is comprised of liquid crystal.

8. An image display device according to claim 1, wherein said display section is comprised of organic light emitting diodes.

9. An image display device according to claim 1, wherein said at least one variable-resistance memory element is disposed in one of a region having an interconnect of circuits and a region which blocks display-producing light.

10. An image display device according to claim 1, wherein each of the phase-change device elements is disposed to extend laterally along one side of a corresponding pixel area.

11. An image display device comprising a display section comprised of a plurality of pixels; and a control section which controls said display section, wherein said image display device includes a nonvolatile phase-change type memory device having a memory for image display which is comprised of phase-change device elements and TFTs, and said nonvolatile phase-change type memory device is comprised of combinations of memory cells, each of said memory cells is comprised of one variable-resistance memory element and one TFT having only a drain electrode connected to said one variable-resistance memory element, and retains display data represented by one bit or more, wherein said at least one variable-resistance memory element is comprised of a chalcogenide material containing at least one element of Te, Se and S, and wherein a resistance of said at least one TFT in a conducting state thereof is in a range of from 10 k$\Omega$ to 500 k$\Omega$ and a resistance of said at least one variable-resistance memory element in a high-resistance state thereof is 1000 k$\Omega$ or more.

12. An image display device according to claim 11, wherein said at least one variable-resistance memory element is fabricated by using a lithographic method, and is free from variations in resistance value due to registration errors of masks.

13. An image display device according to claim 11, wherein said at least one variable-resistance memory element is covered with a material other than Al such that said at least one variable-resistance memory element is not in direct contact with an Al material.

14. An image display device according to claim 11, wherein said at least one variable-resistance memory element is sandwiched in a direction of a thickness thereof and protected by a plurality of protective films capable of suppressing influences of mobile ions.

15. An image display device according to claim 11, wherein said nonvolatile phase-change type memory device is included in said control section, and serves as a frame memory which retains display data for one frame.

16. An image display device according to claim 11, wherein said display section is comprised of liquid crystal.

17. An image display device according to claim 11, wherein said display section is comprised of organic light emitting diodes.

18. An image display device according to claim 11, wherein said at least one variable-resistance memory element is disposed in one of a region having an interconnect of circuits and a region which blocks display-producing light.

19. An image display device according to claim 11, wherein each of the phase-change device elements is disposed to extend laterally along one side of a corresponding pixel area.

* * * * *